(12) United States Patent
Yamaguchi et al.

(10) Patent No.: US 9,219,100 B2
(45) Date of Patent: Dec. 22, 2015

(54) SEMICONDUCTOR DEVICE AND SOLID-STATE IMAGE PICKUP UNIT

(71) Applicant: Sony Corporation, Tokyo (JP)

(72) Inventors: Tetsuji Yamaguchi, Kanagawa (JP); Kazunori Nagahata, Kanagawa (JP); Toshihiro Miura, Kanagawa (JP); Kaori Takimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/160,016

(22) Filed: Jan. 21, 2014

(65) Prior Publication Data

US 2014/0209876 A1 Jul. 31, 2014

(30) Foreign Application Priority Data

Jan. 28, 2013 (JP) ................................. 2013-013554

(51) Int. Cl.
*H01L 27/30* (2006.01)
*H01L 27/146* (2006.01)
*H01L 21/74* (2006.01)

(52) U.S. Cl.
CPC ............ *H01L 27/307* (2013.01); *H01L 21/743* (2013.01); *H01L 27/1464* (2013.01); *H01L 27/14647* (2013.01); *H01L 27/14667* (2013.01)

(58) Field of Classification Search
CPC ..... H01L 27/307; H01L 51/448; H01L 27/30; H01L 27/1464; H01L 27/14647; H01L 27/14667; H01L 27/14641; H01L 27/14627
See application file for complete search history.

(56) References Cited

U.S. PATENT DOCUMENTS

| | | | |
|---|---|---|---|
| 7,749,799 B2 * | 7/2010 | Pain | 438/75 |
| 8,917,342 B2 * | 12/2014 | Ohta | 348/308 |
| 2008/0265352 A1 * | 10/2008 | Akiyoshi | 257/432 |
| 2011/0019042 A1 * | 1/2011 | Yamaguchi | 348/280 |
| 2011/0156104 A1 * | 6/2011 | Yamaguchi | 257/222 |
| 2011/0216212 A1 * | 9/2011 | Watanabe et al. | 348/222.1 |
| 2013/0020663 A1 * | 1/2013 | Takimoto | 257/431 |
| 2014/0353651 A1 * | 12/2014 | Takimoto et al. | 257/40 |
| 2014/0367668 A1 * | 12/2014 | Fujii et al. | 257/40 |

FOREIGN PATENT DOCUMENTS

JP 2012-60076 A 3/2012

* cited by examiner

*Primary Examiner* — Marc Armand
*Assistant Examiner* — Younes Boulghassoul
(74) *Attorney, Agent, or Firm* — Sheridan Ross P.C.

(57) ABSTRACT

A solid-state image pickup unit including a pixel section having a plurality of unit pixels two-dimensionally arranged in a matrix formation, wherein a unit pixel includes a conductive region of a first conductivity type having a surface adjacent to a multilayer wiring layer, a charge accumulation region of a second conductivity type formed within the first conductive region, wherein the charge accumulation region is separated from the surface of the conductive region adjacent to the multilayer wiring layer by a separation section, and a contact disposed in the conductive region, the contact electrically connecting the charge accumulation region and an external wire of the multilayer wiring layer.

13 Claims, 30 Drawing Sheets

SEMICONDUCTOR DEVICE AND SOLID-STATE IMAGE PICKUP UNIT

CROSS REFERENCE TO RELATED APPLICATIONS

This application claims the benefit of Japanese Priority Patent Application JP 2013-13554 filed Jan. 28, 2013, the entire contents of which are incorporated herein by reference.

BACKGROUND

The present technology relates to a semiconductor device such as an image pickup device and to a semiconductor unit including the same.

In a solid-state image pickup apparatus such as a CCD (Image Coupled Device) image sensor and a CMOS (Complementary Metal Oxide Semiconductor) image sensor, as pixel size is reduced, the number of photons entering a unit pixel (solid-state image pickup device) is decreased, leading to lowered sensitivity and a lowered saturated charge amount.

Therefore, a method of obtaining three-color photoelectric conversion signals by one pixel by layering three photoelectric conversion sections has been proposed. For example, one of the three photoelectric conversion sections (such as a photoelectric conversion section corresponding to green color light) is arranged on a silicon substrate (semiconductor substrate), that is, outside the silicon substrate, while the remaining two photoelectric conversion sections (such as photoelectric conversion sections corresponding to red color light and blue color light) are provided inside the silicon substrate. In such an image pickup device, all incident photons are allowed to be used for photoelectric conversion, and therefore, image quality may be improved thereby.

However, in the image pickup device having a photoelectric conversion section outside the silicon substrate, charge is transferred from the photoelectric conversion section outside the silicon substrate to inside of the silicon substrate, and is accumulated therein. Therefore, there is a disadvantage that noise is generated at the time of the foregoing charge transfer (for example, Japanese Unexamined Patent Application Publication No. 2012-60076).

SUMMARY

Although a method of reducing such noise is described in the foregoing Japanese Unexamined Patent Application Publication No. 2012-60076, such a method is not sufficient yet. Therefore, it is desired to more effectively prevent generation of noise.

It is desirable to provide a semiconductor device in which generation of noise at the time of charge transfer between inside and outside of a semiconductor substrate is decreased and a semiconductor unit including the semiconductor device.

In accordance with at least one embodiment of the present invention, a semiconductor device is provided, the semiconductor device comprising a conductive region of a first conductivity type having a surface adjacent to a multilayer wiring layer, a charge accumulation region of a second conductivity type formed within the first conductive region, wherein the charge accumulation region is separated from the surface of the conductive region adjacent to the multilayer wiring layer by a separation section, and a contact disposed in the conductive region, the contact electrically connecting the charge accumulation region and an external wire of the multilayer wiring layer.

In accordance with at least one embodiment of the present invention a solid-state image pickup unit is provided, the solid-state image pickup unit comprising a pixel section having a plurality of unit pixels two-dimensionally arranged in a matrix formation, wherein a unit pixel comprises: a conductive region of a first conductivity type having a surface adjacent to a multilayer wiring layer, a charge accumulation region of a second conductivity type formed within the first conductive region, wherein the charge accumulation region is separated from the surface of the conductive region adjacent to the multilayer wiring layer by a separation section, and a contact disposed in the conductive region, the contact electrically connecting the charge accumulation region and an external wire of the multilayer wiring layer.

In accordance with at least one embodiment of the present invention, a method of manufacturing a semiconductor device is provided, the method comprising the steps of forming, within a conductive region of a first conductivity type, a charge accumulation region of a second conductivity type, wherein the charge accumulation region is separated from a surface of the conductive region adjacent to a multilayer wiring layer by a separation section, forming the multilayer wiring layer on a surface of the conductive region of the first conductivity type, wherein forming the multilayer wiring layer comprises: forming a connection hole extending from the multilayer wiring layer to the charge accumulation layer, providing an insulation film on a sidewall of the connection hole to form an insulation section, burying material in the connection hole such that a contact is electrically connected to the charge accumulation region, forming an external wire of the multilayer wiring layer, wherein the external wire is electrically connected to the charge accumulation region via the contact, and bonding a support substrate to the multilayer wiring layer.

According to the semiconductor device and the semiconductor unit according to the embodiments of the present technology, the size of a portion where the depletion layer created between the first conductive region and the second conductive region is in contact with the insulating film is decreased. Therefore, generation of noise may be suppressed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

Figure 1:
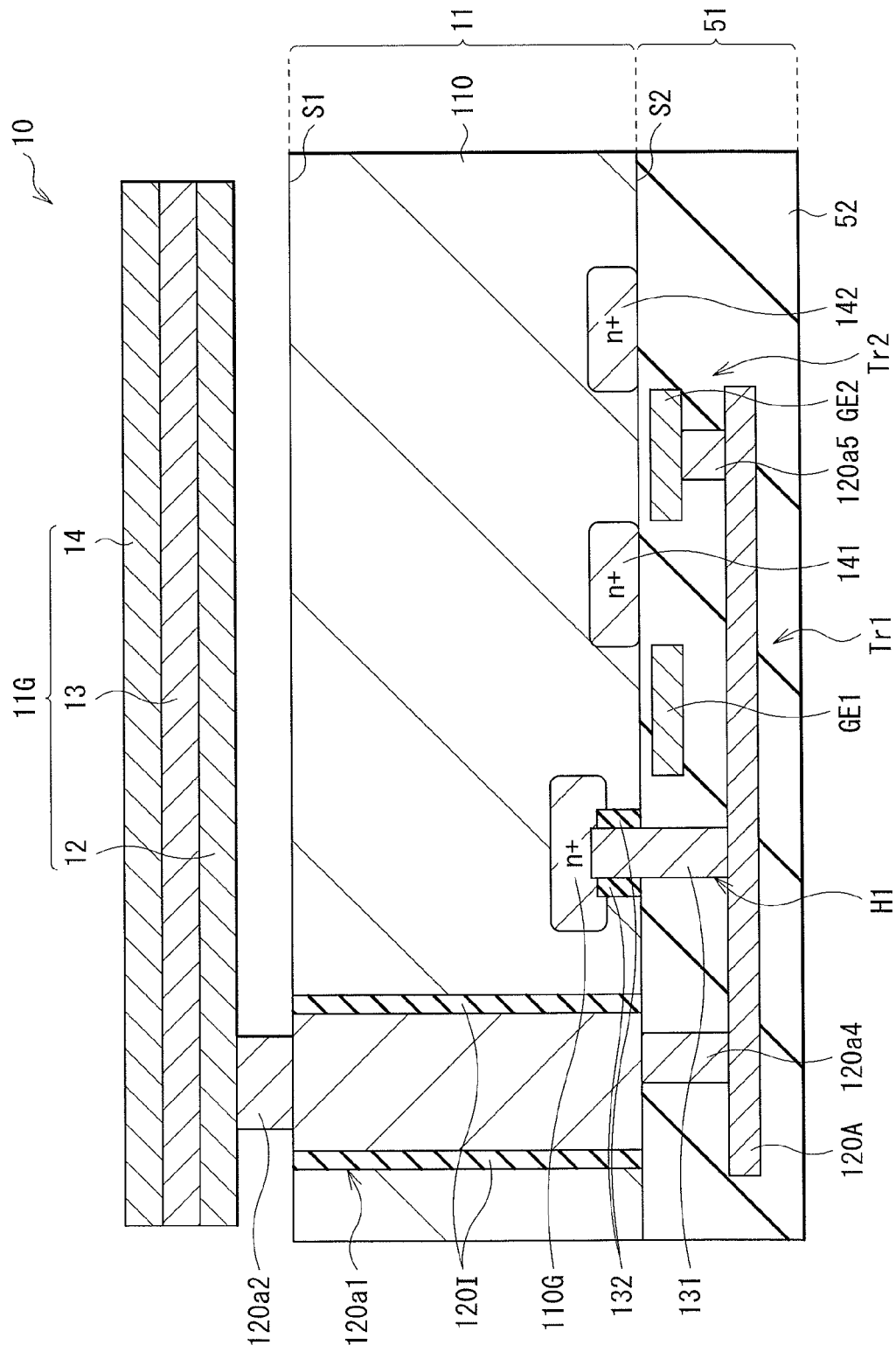
FIG. 1 is a cross-sectional view illustrating a configuration of a main section of an image pickup device according to a first embodiment of the present technology.
Figure 12:
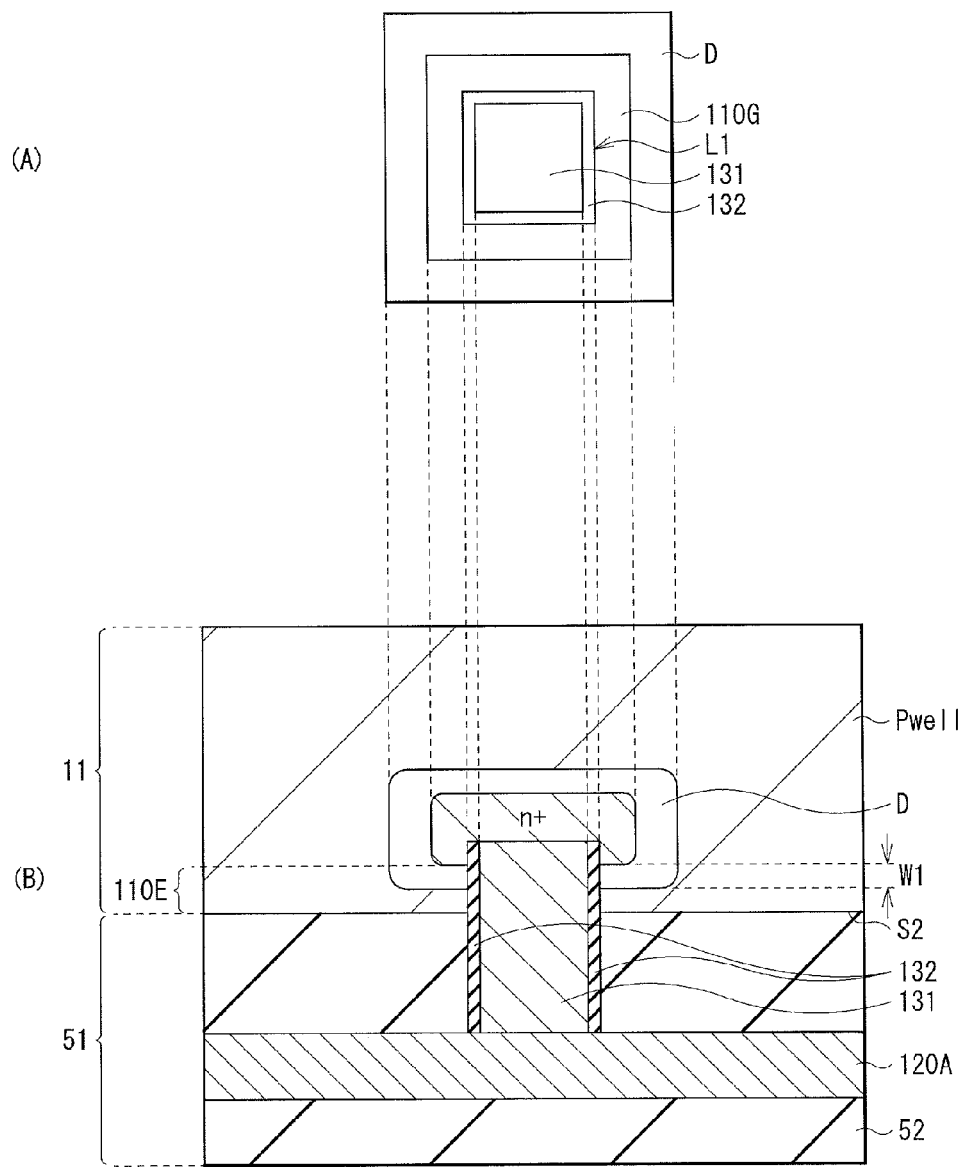

Part (A) and Part (B) of FIG. 12 are a plan view and a cross-sectional view for explaining a depletion layer around a green-use electric storage layer illustrated in FIG. 1.

Figure 13:
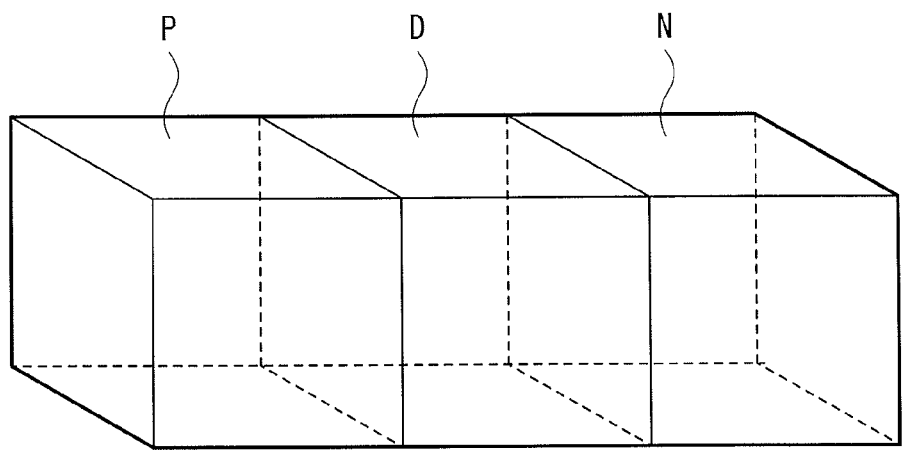

FIG. 13 is a pattern diagram for explaining a depletion layer created between a p-type semiconductor region and an n-type semiconductor region.

Figure 14:
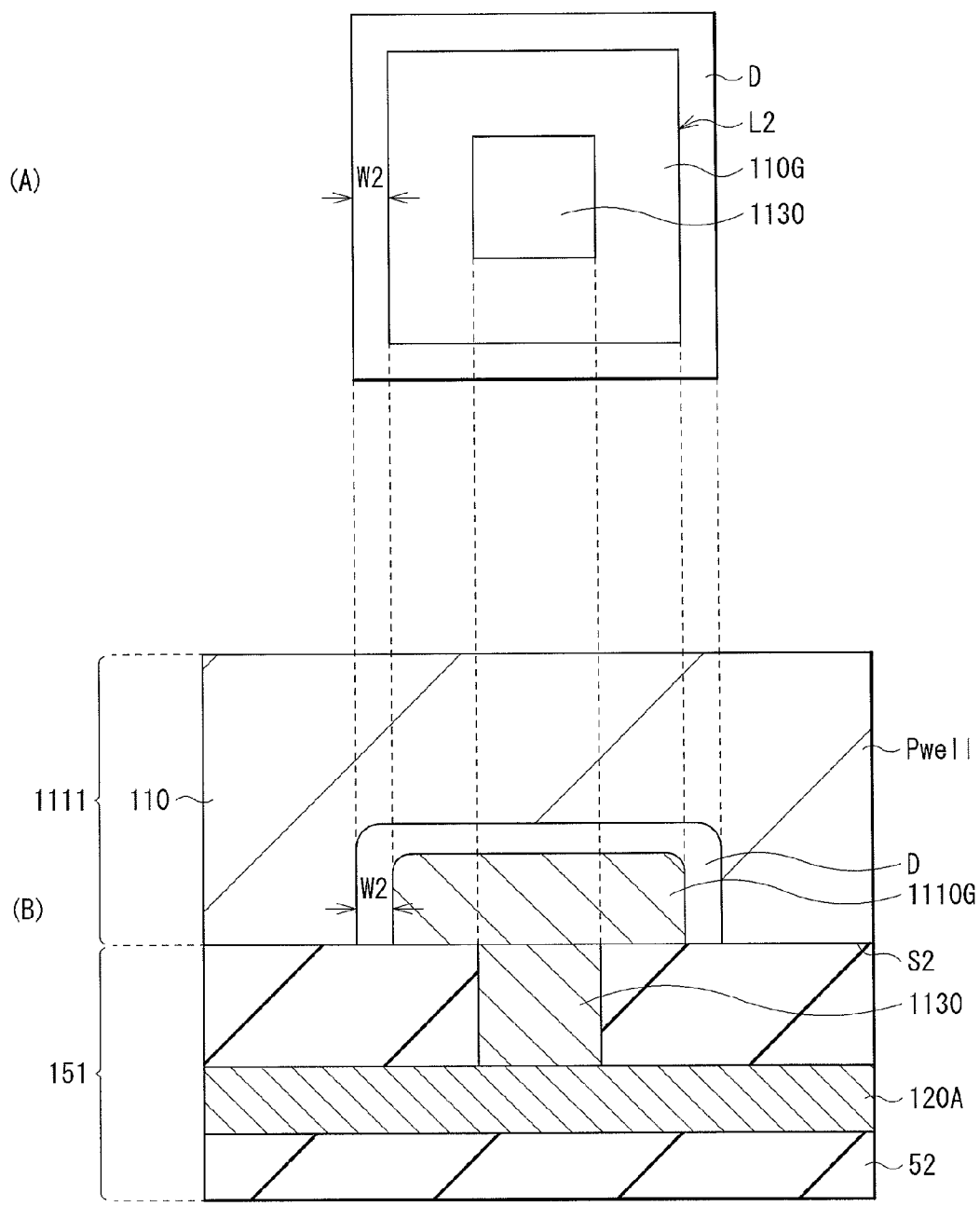

Part (A) and Part (B) of FIG. 14 are a plan view and a cross-sectional view that illustrate a configuration of a green-use electric storage layer according to a comparative example.

Figure 15:
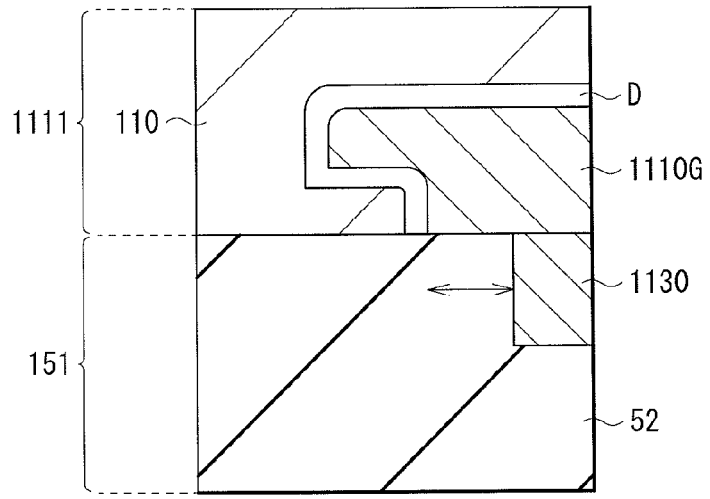

FIG. 15 is a cross-sectional view for explaining size of the green-use electric storage layer illustrated in Part (B) of FIG. 14.

Figure 16:
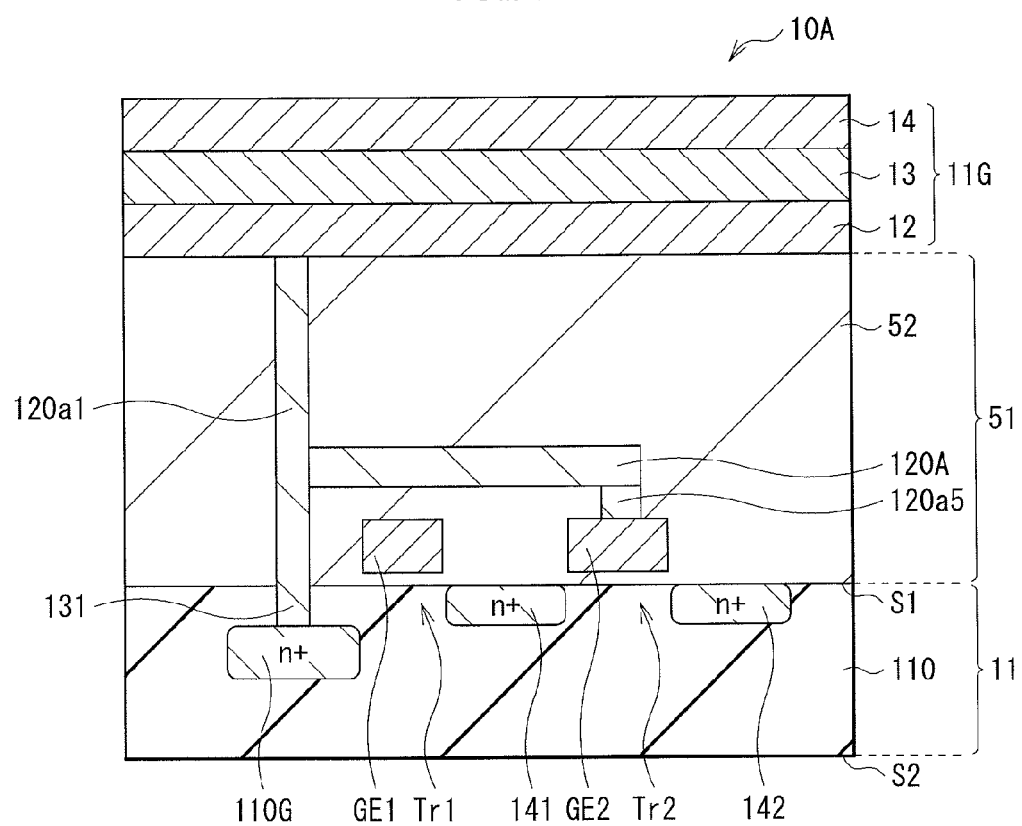

FIG. 16 is a cross-sectional view illustrating a configuration of a main section of an image pickup device according to Modification 1.

Figure 17:
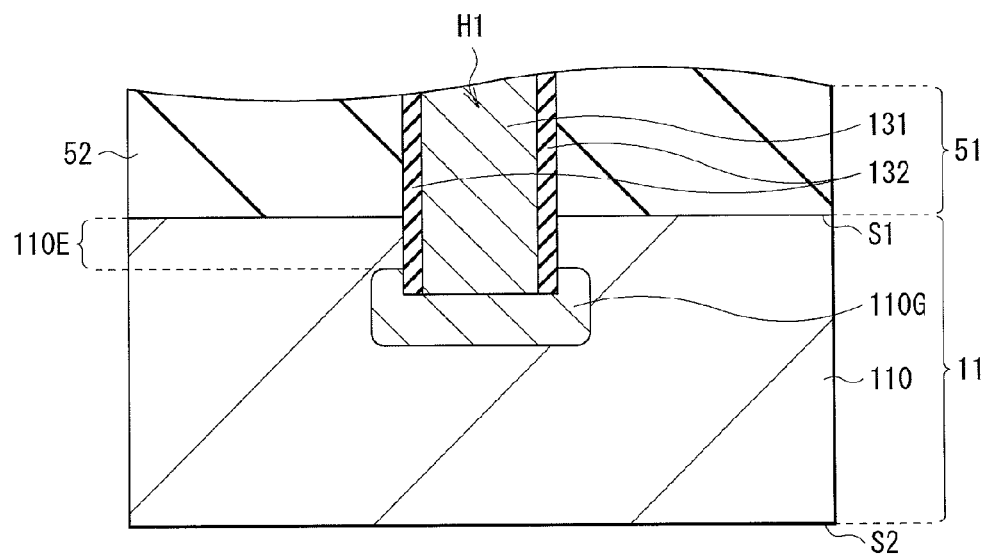

FIG. 17 is a cross-sectional view illustrating configurations of a green-use electric storage layer illustrated in FIG. 16 and the vicinity thereof.

Figure 18:
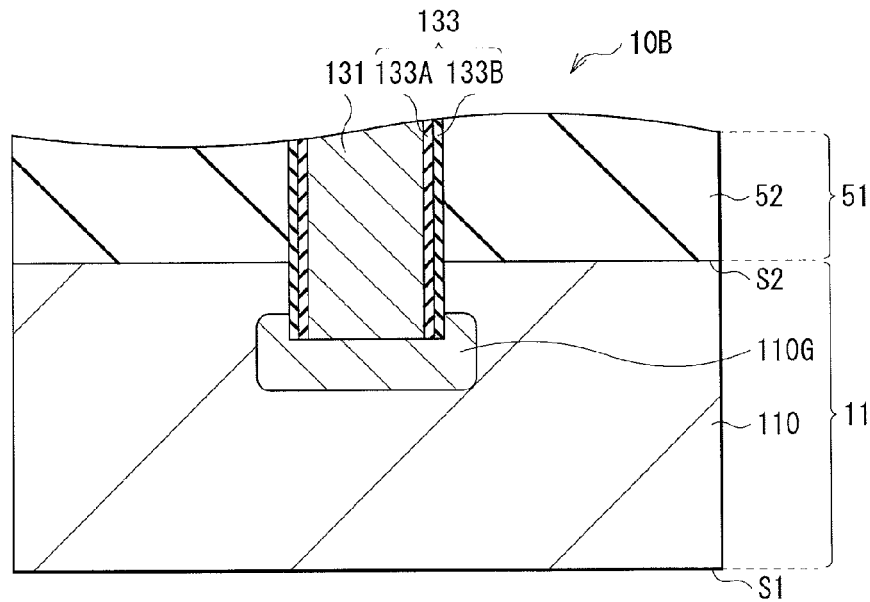

FIG. 18 is a cross-sectional view illustrating a configuration of an image pickup device according to Modification 2.

Figure 19:
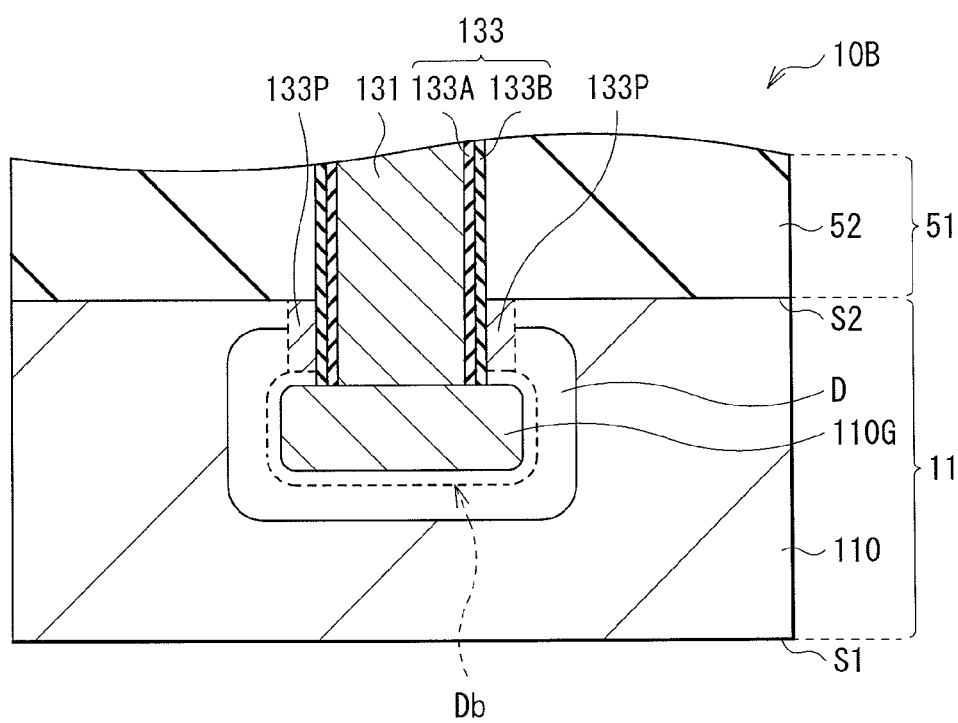

FIG. 19 is a cross-sectional view for explaining a function of an insulating section illustrated in FIG. 18.

Figure 20A:
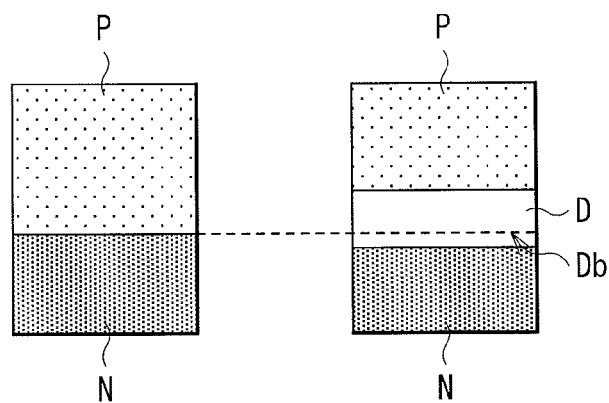

FIG. 20A is a pattern diagram for explaining a position where a depletion layer is created.

Figure 20B:
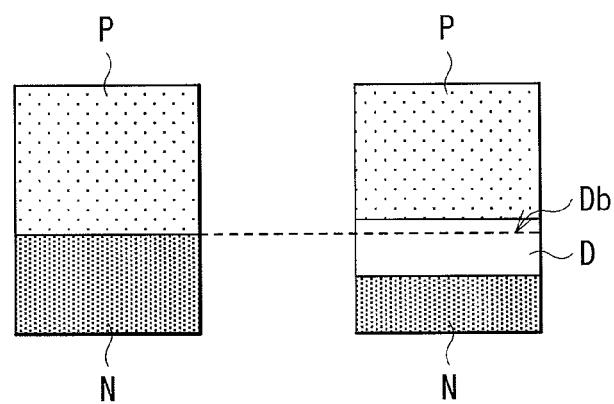

FIG. 20B is a pattern diagram illustrating another example of the depletion layer illustrated in FIG. 20A.

Figure 21A:
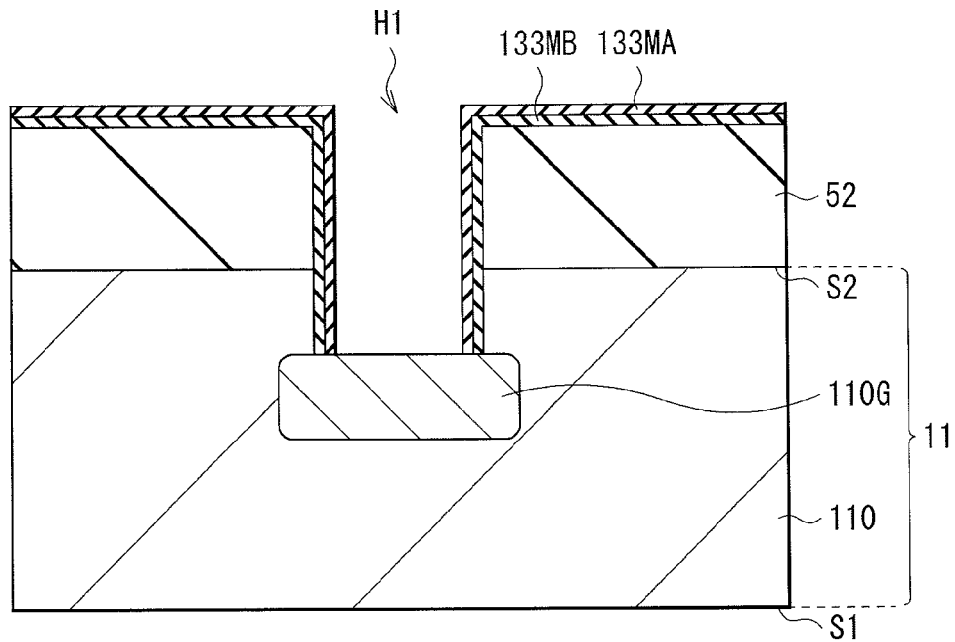

FIG. 21A is a cross-sectional view illustrating an example of a step of manufacturing the insulating section illustrated in FIG. 18.

Figure 21B:
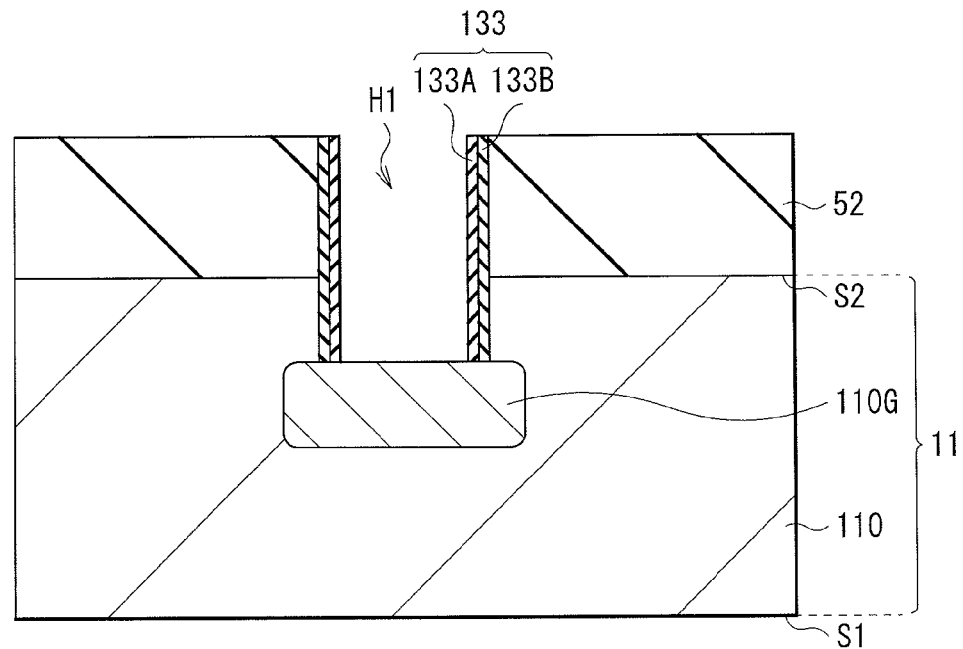

FIG. 21B is a view illustrating a step following the step of FIG. 21A.

Figure 22:
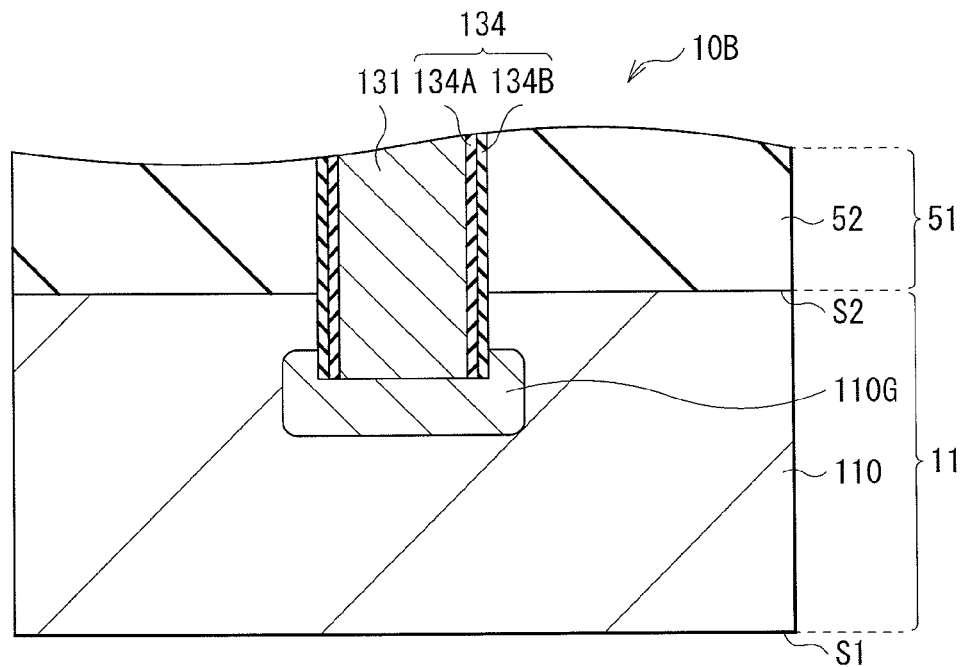

FIG. 22 is a cross-sectional view illustrating a configuration of an image pickup device according to Modification 3.

Figure 23:
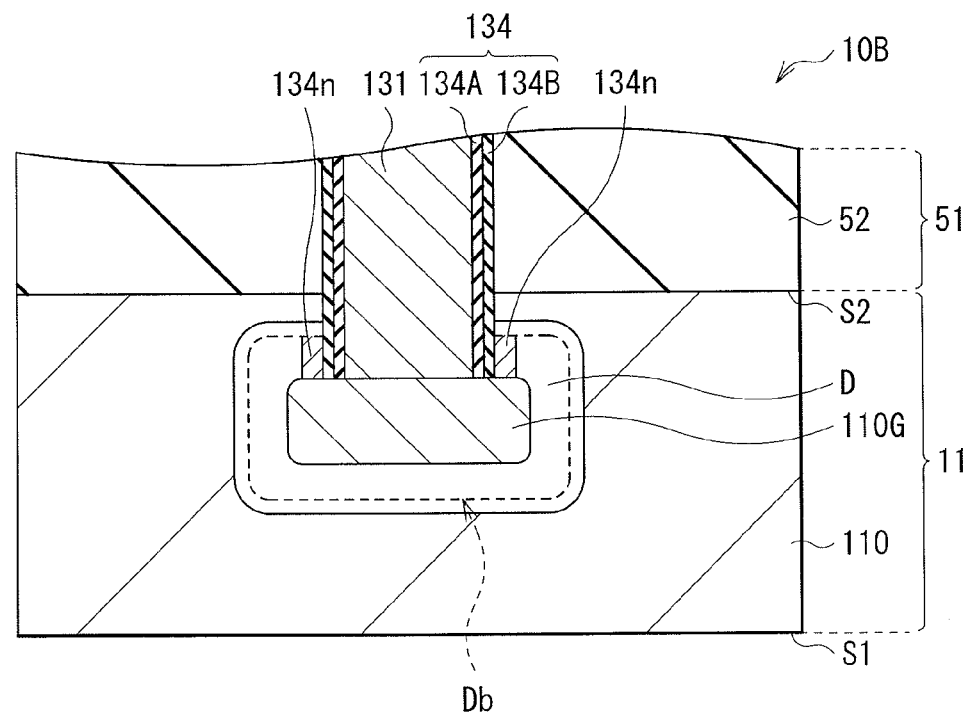

FIG. 23 is a cross-sectional view for explaining a function of an insulating section illustrated in FIG. 22.

Figure 24A:
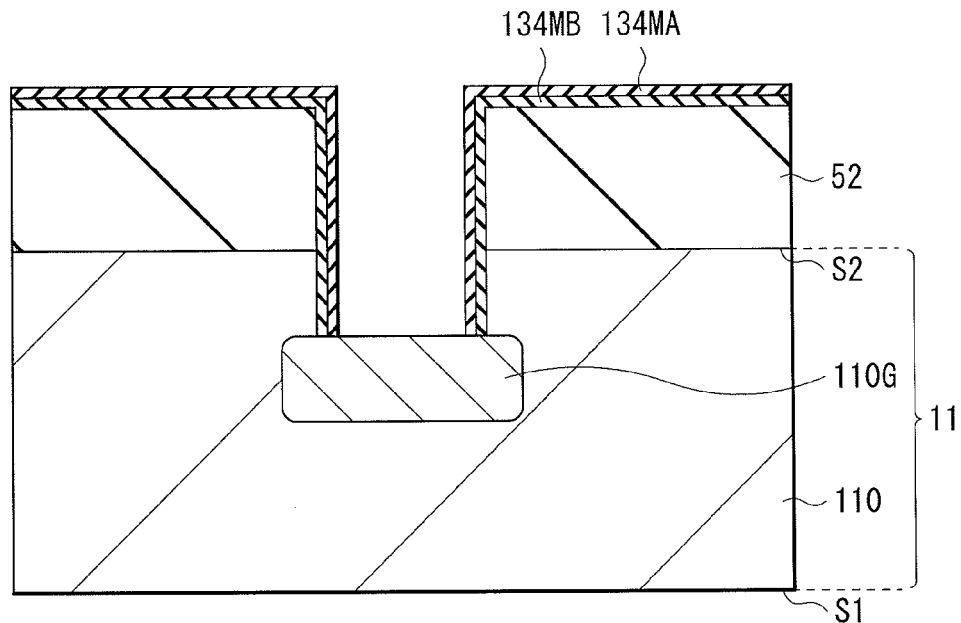

FIG. 24A is a cross-sectional view illustrating an example of a step of manufacturing the insulating section illustrated in FIG. 22.

Figure 24B:
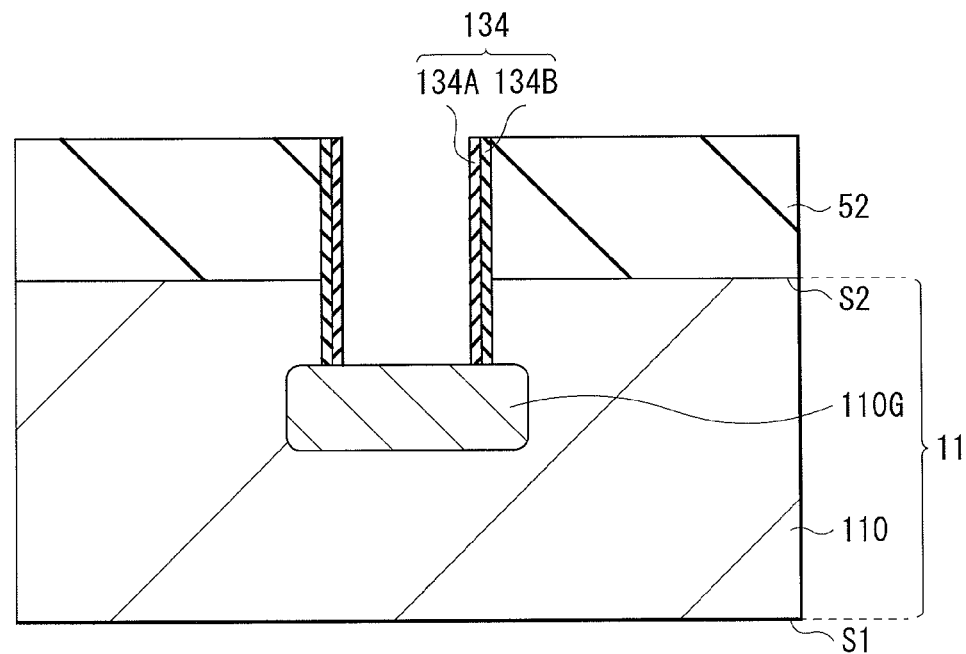

FIG. 24B is a view illustrating a step following the step of FIG. 24A.

Figure 25:
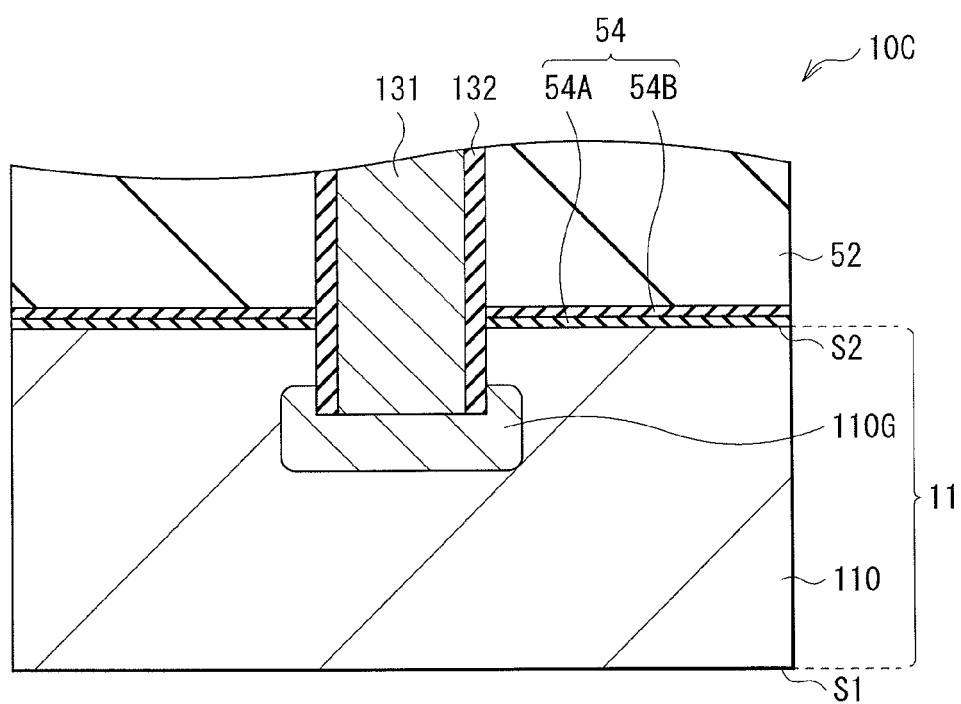

FIG. 25 is a cross-sectional view illustrating a configuration of an image pickup device according to Modification 4.

Figure 26A:
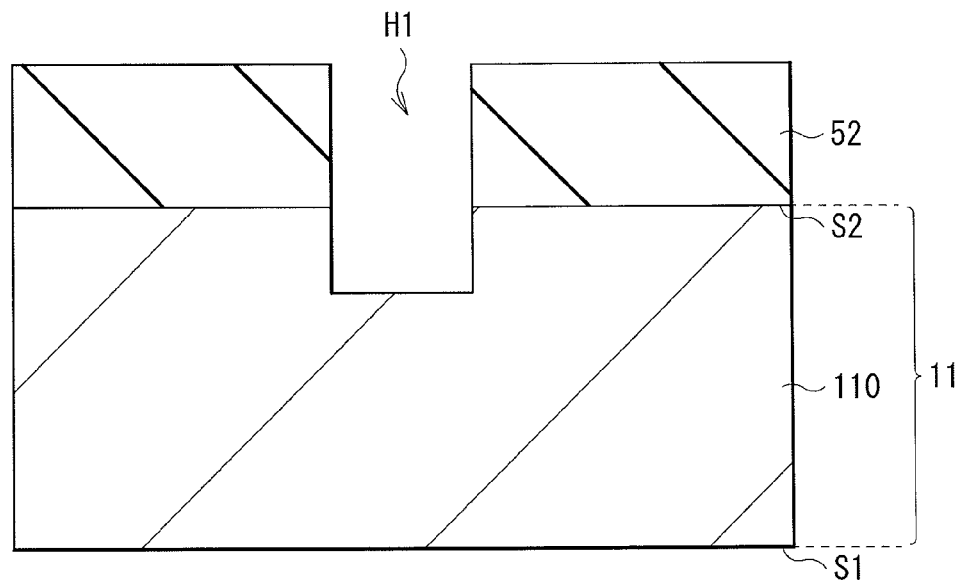

FIG. 26A is a cross-sectional view illustrating a step of manufacturing an image pickup device according to Modification 5.

Figure 26B:
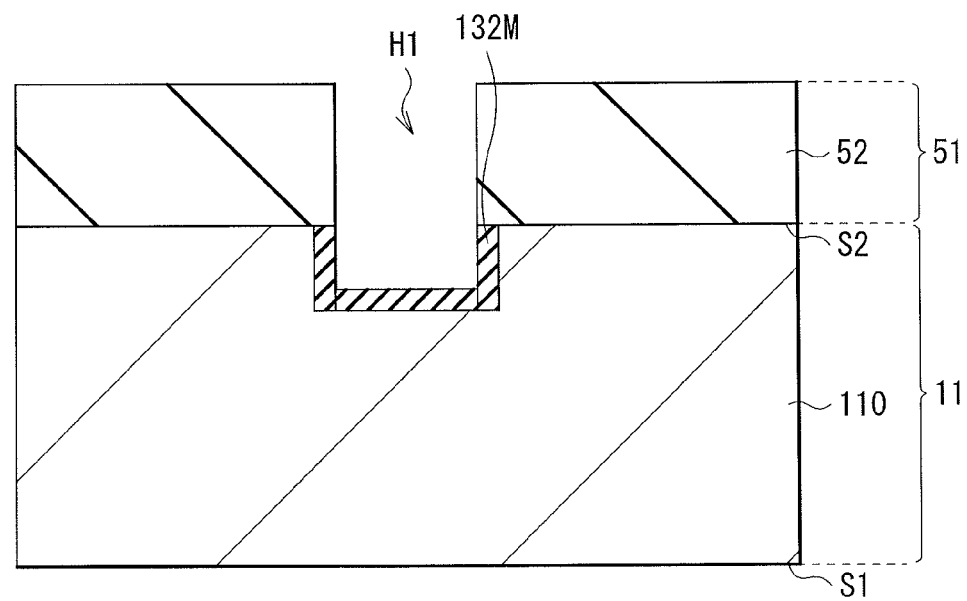

FIG. 26B is a view illustrating a step following the step of FIG. 26A.

Figure 27A:
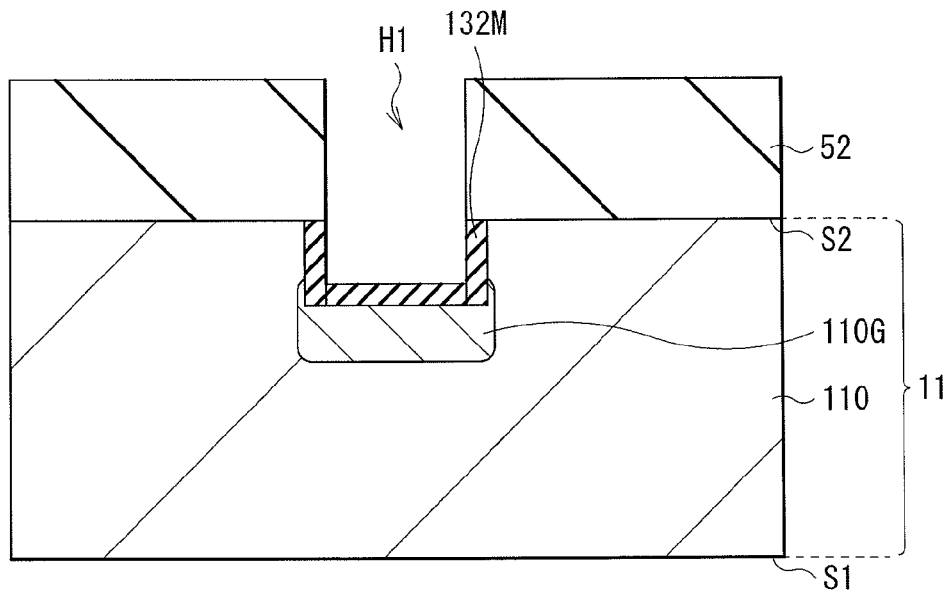

FIG. 27A is a cross-sectional view illustrating a step following the step of FIG. 26B.

Figure 27B:
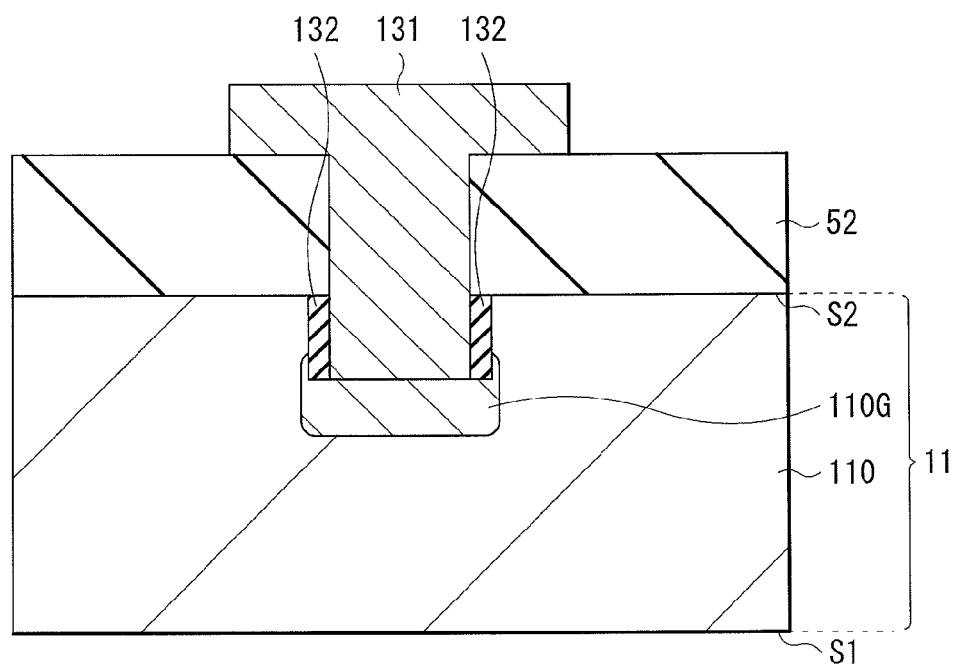

FIG. 27B is a view illustrating a step following the step of FIG. 27A.

Figure 28:
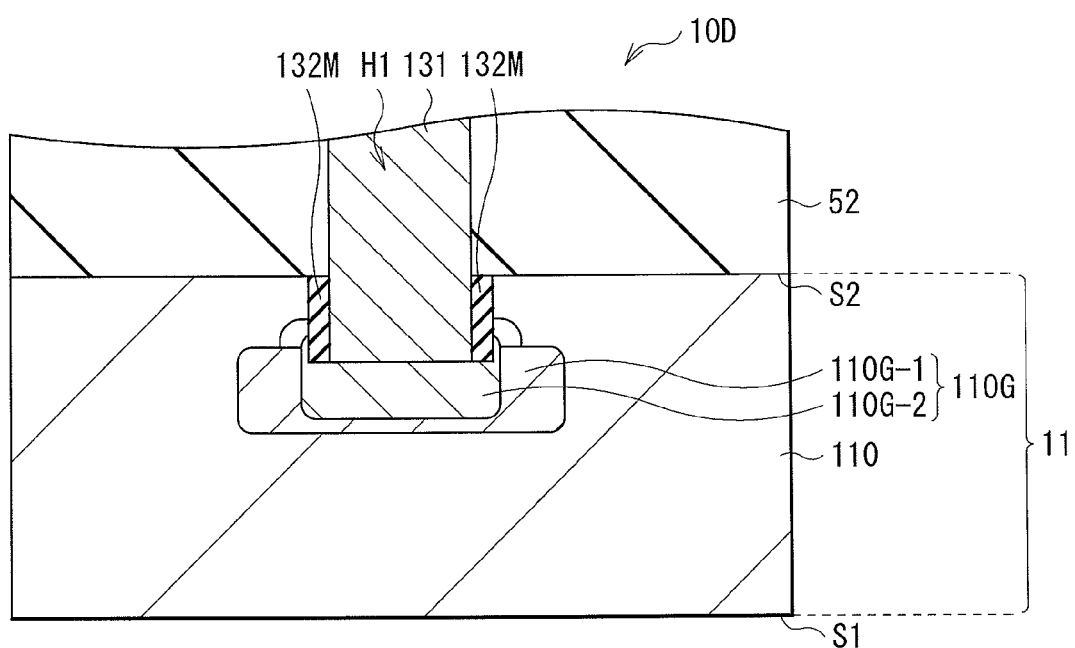

FIG. 28 is a cross-sectional view illustrating a configuration of an image pickup device according to Modification 6.

Figure 29A:
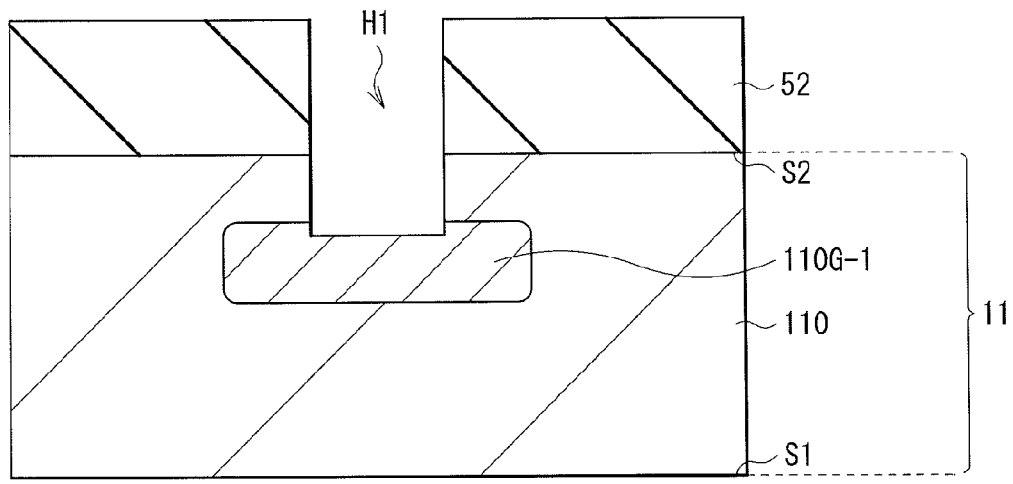

FIG. 29A is a cross-sectional view illustrating a step of manufacturing the image pickup device illustrated in FIG. 28.

Figure 29B:
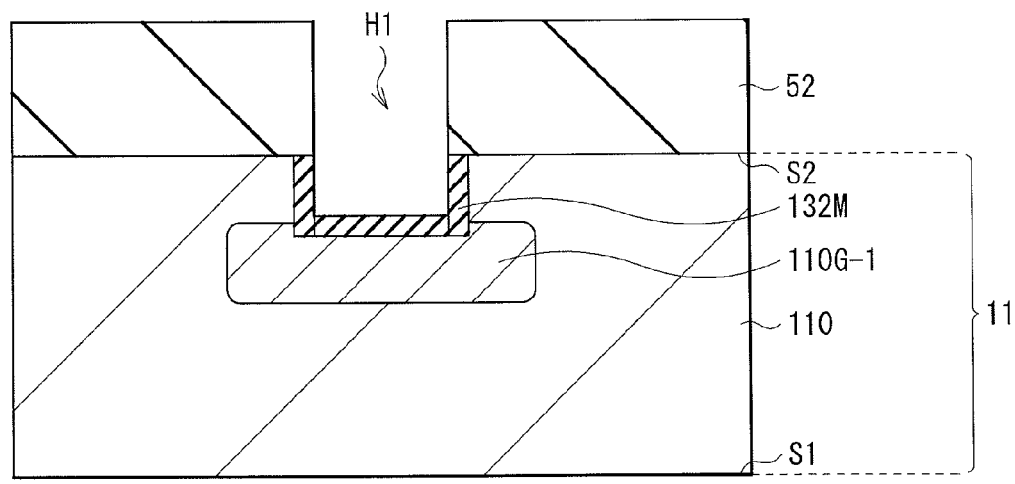

FIG. 29B is a cross-sectional view illustrating a step following the step of FIG. 29A.

Figure 29C:
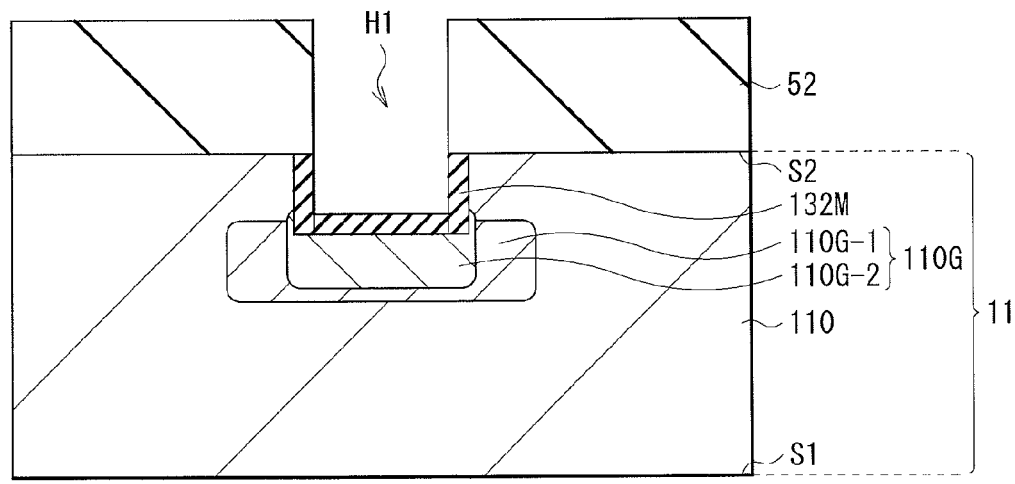

FIG. 29C is a cross-sectional view illustrating a step following the step of FIG. 29B.

Figure 30:
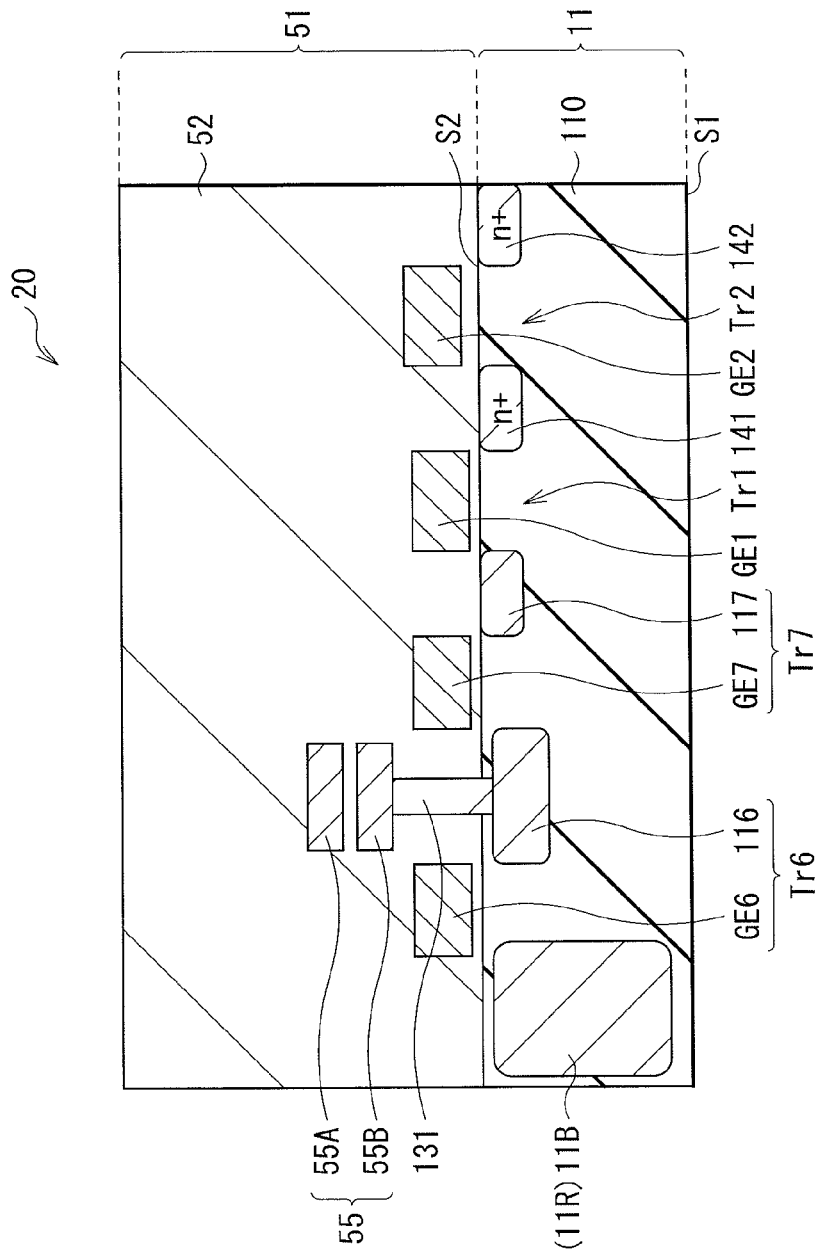

FIG. 30 is a cross-sectional view illustrating a configuration of an image pickup device according to a second embodiment of the present technology.

Figure 31:
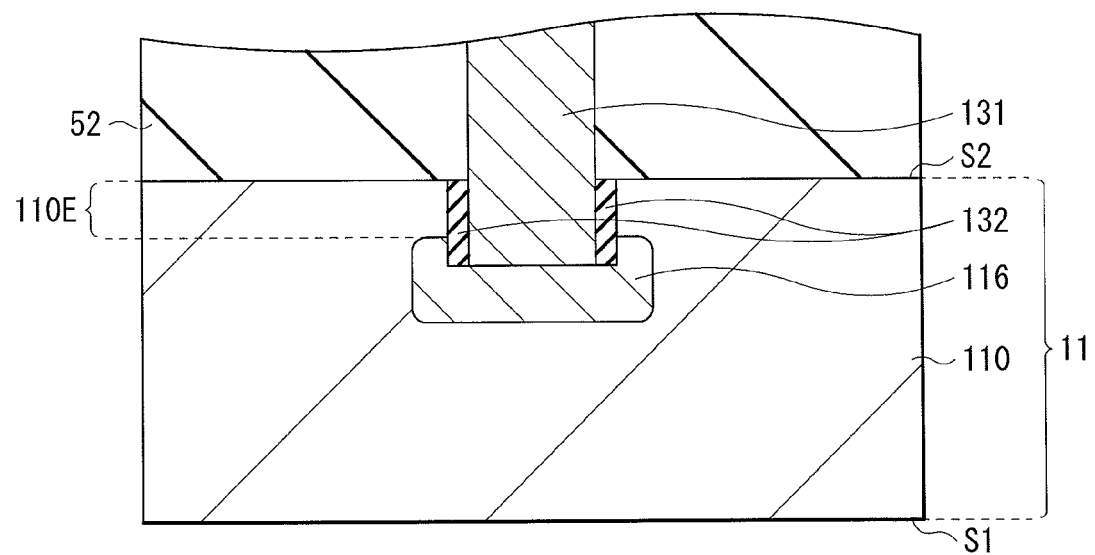

FIG. 31 is a cross-sectional view illustrating a configuration of an electric storage layer illustrated in FIG. 30.

Figure 32:
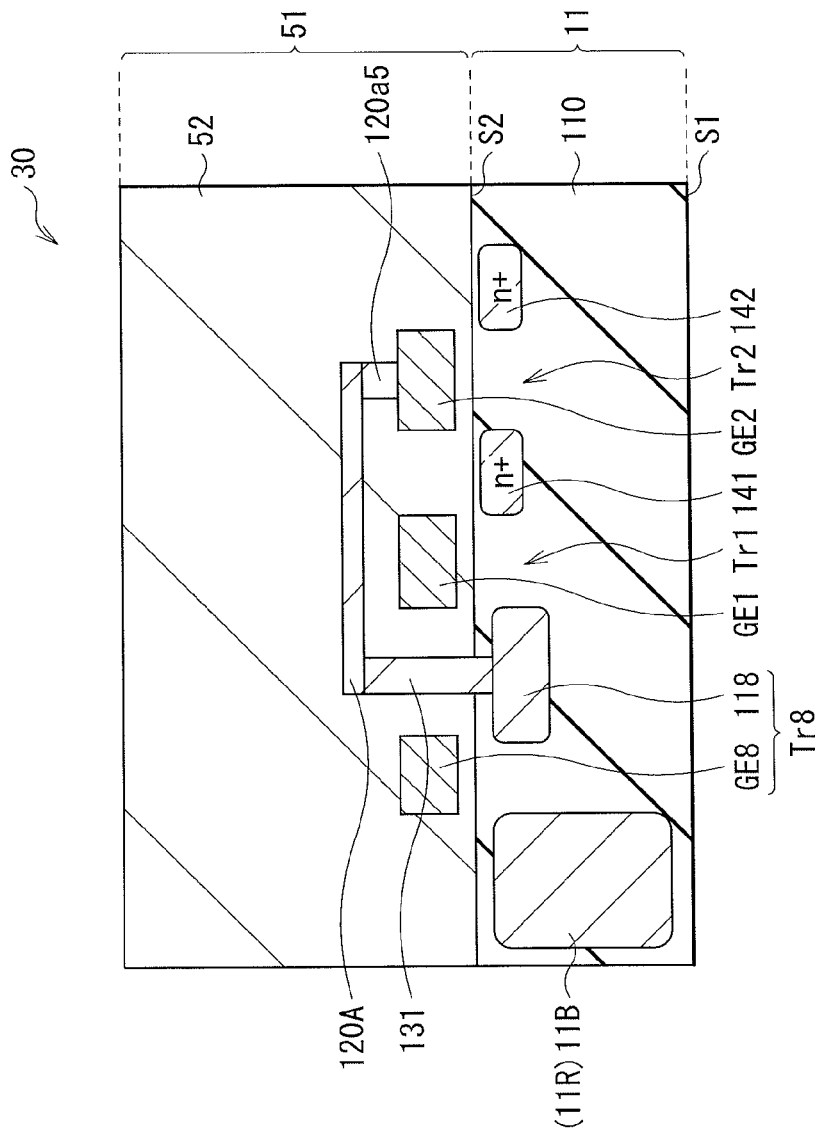

FIG. 32 is a cross-sectional view illustrating a configuration of an image pickup device according to a third embodiment of the present technology.

Figure 33:
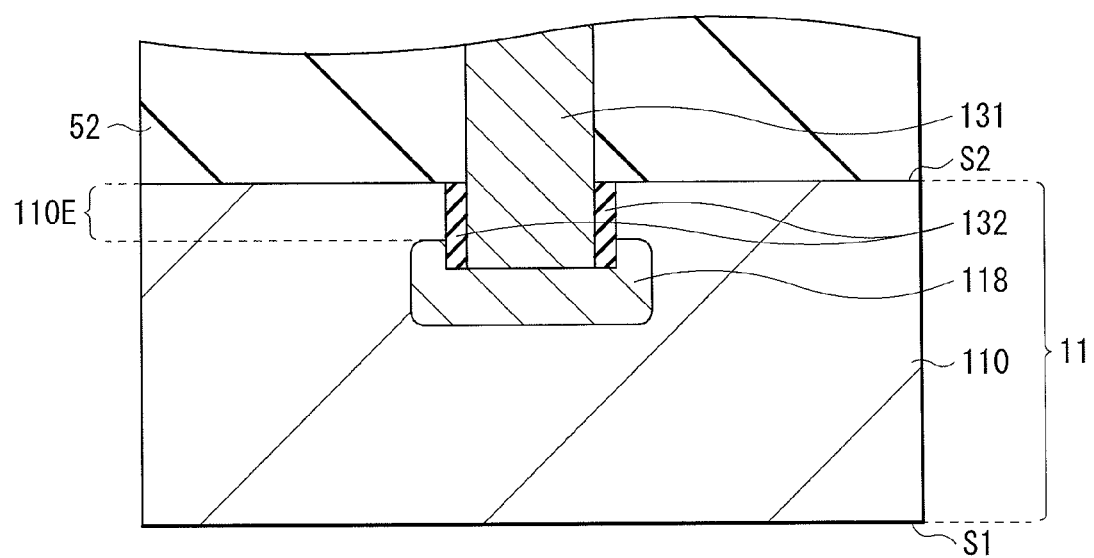

FIG. 33 is a cross-sectional view illustrating a configuration of a floating diffusion illustrated in FIG. 32.

Figure 34:
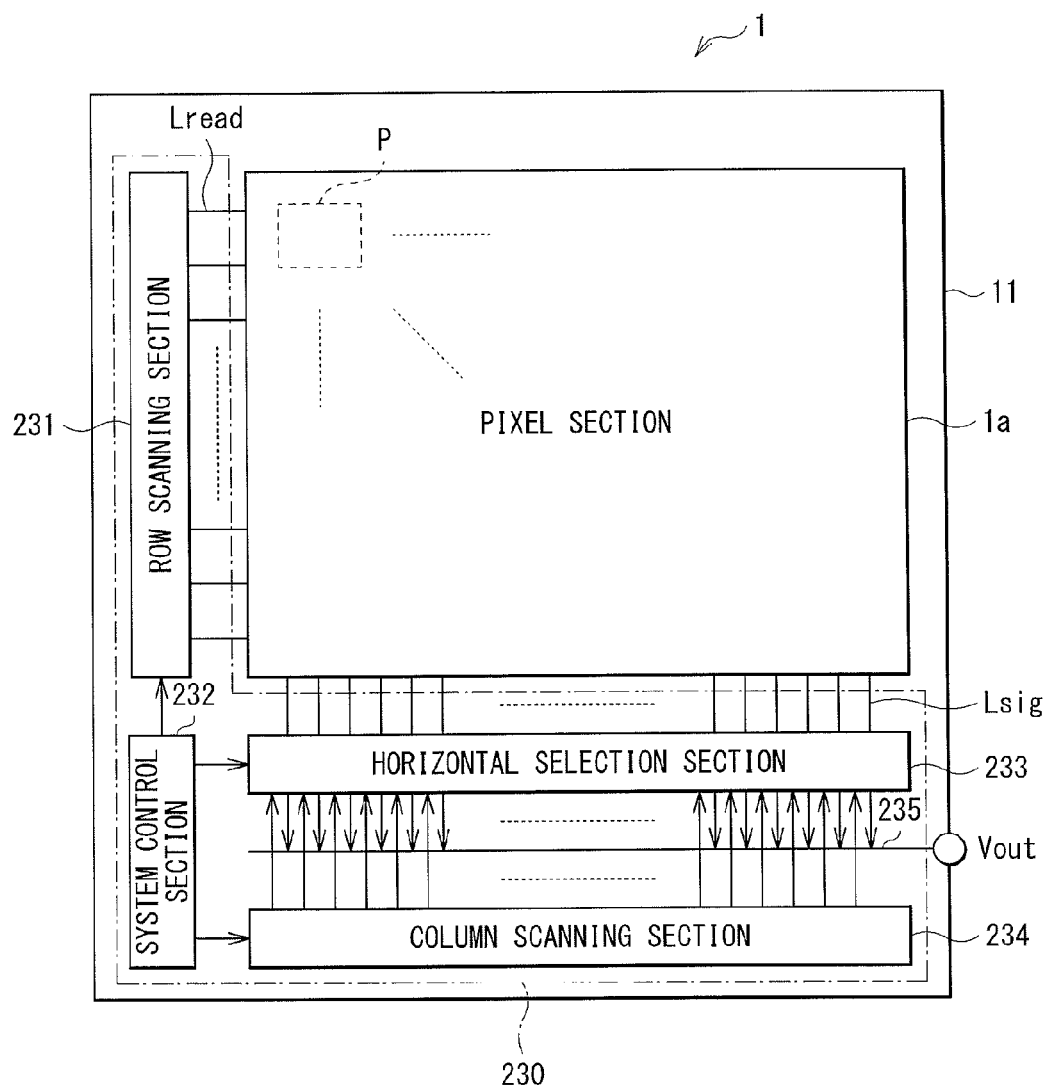

FIG. 34 is a pattern diagram illustrating a whole configuration of an image pickup unit using the image pickup device illustrated in FIG. 1 and the like.

Figure 35:
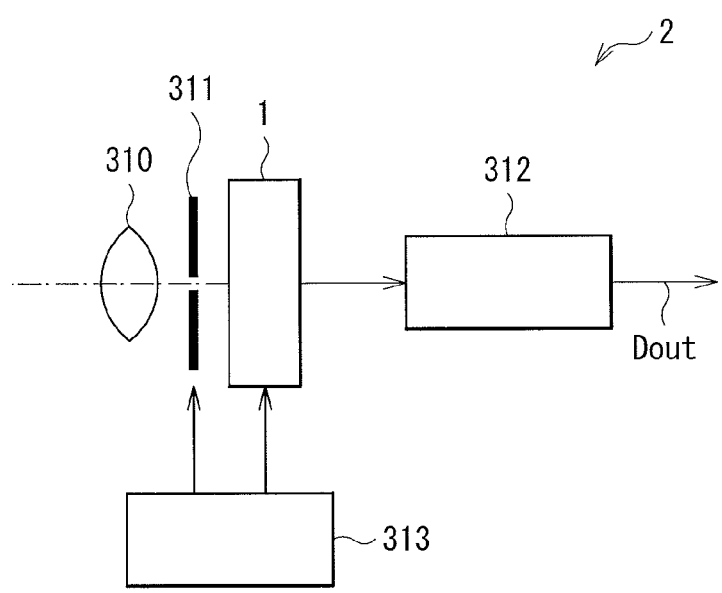

FIG. 35 is a view illustrating a schematic configuration of an electronic apparatus to which the image pickup unit illustrated in FIG. 34 is applied.

DETAILED DESCRIPTION

Embodiments of the present technology will be hereinafter described in detail with reference to the drawings. The description will be given in the following order.
1. First Embodiment (an example in which a green-use electric storage layer has a separation section between the green-use electric storage layer and one surface of a semiconductor substrate: backside-illumination type)
2. Modification 1 (frontside-illumination type)
3. Modification 2 (an insulating section having negative fixed charge)
4. Modification 3 (an insulating section having positive fixed charge)
5. Modification 4 (an insulating film having negative fixed charge)
6. Modification 5 (a green-use electric storage layer formed in a manner of self-aligning)
7. Modification 6 (a green-use electric storage layer having n-type semiconductor regions with a plurality of concentrations)
8. Second Embodiment (an example in which an electric storage layer electrically connected to a retentive capacity has a separation section between the electric storage layer and one surface of a semiconductor substrate)
9. Third Embodiment (an example in which a floating diffusion has a separation section between the floating diffusion and one surface of a semiconductor substrate)

First Embodiment

Configuration of Image Pickup Device 10

FIG. 1 schematically illustrates a cross-sectional configuration of an image pickup device 10 (a semiconductor device)

according to a first embodiment of the present technology. The image pickup device 10 configures one pixel (such as a pixel P of after-mentioned FIG. 34) in an image pickup unit (such as an image pickup unit 1 of after-mentioned FIG. 34) such as a CCD image sensor and a CMOS image sensor. The image pickup device 10 is backside-illumination type, and is provided with a multilayer wiring layer 51 on a surface (a surface S2) on the opposite side of a light receiving surface (a surface S1) of a semiconductor substrate 11. On the surface S1 of the semiconductor substrate 11, an organic photoelectric conversion section 11G (a second photoelectric conversion section) is arranged. The organic photoelectric conversion section 11G is electrically connected to a green-use electric storage layer 110G in the semiconductor substrate 11 through conductive plugs 120a2, 120a1, and 120a4, a wiring 120A, and a contact 131.

Figure 2:
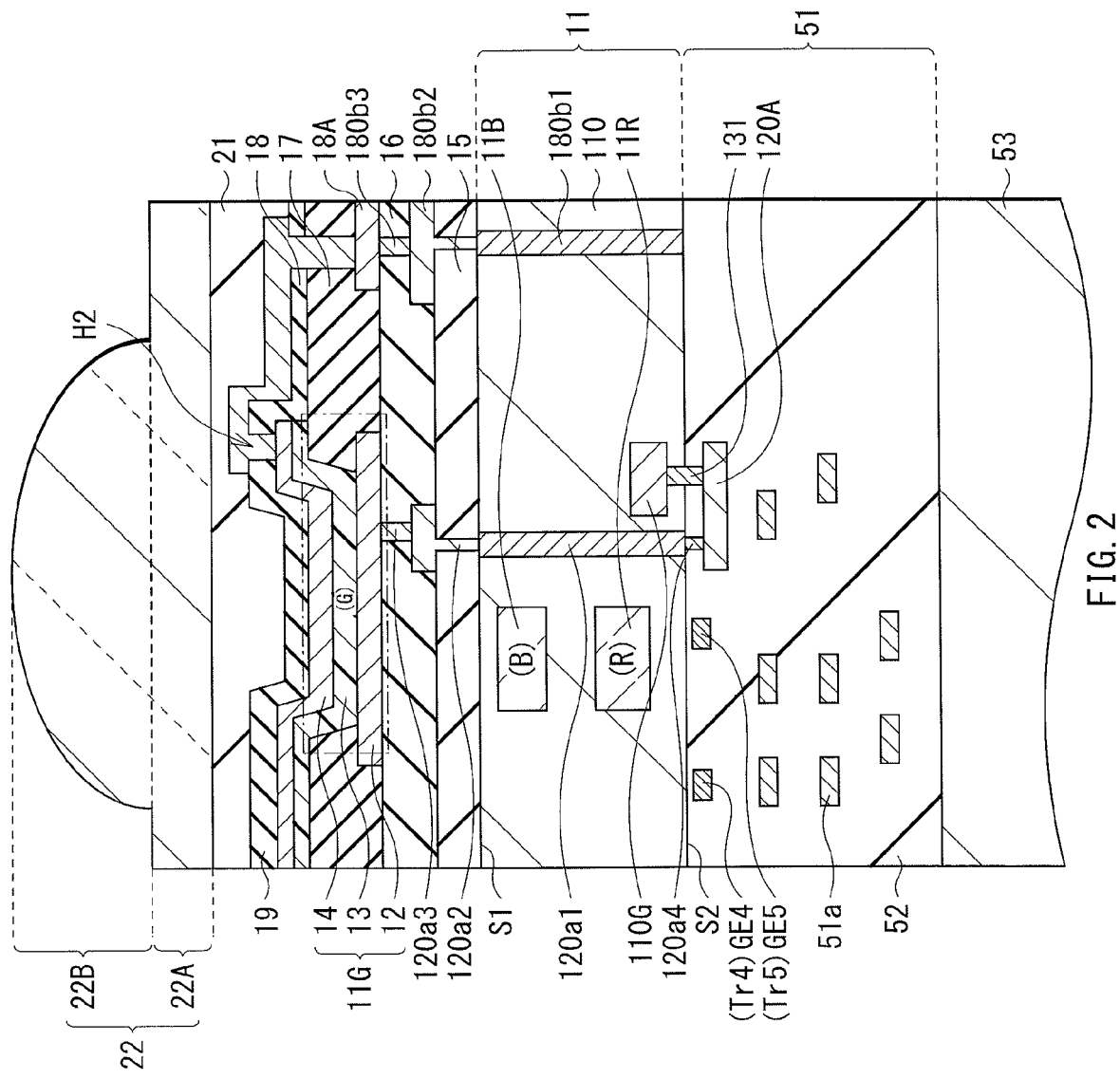
FIG. 2 is a cross-sectional view illustrating a whole configuration of the image pickup device illustrated in FIG. 1.

As illustrated in FIG. 2, inside the semiconductor substrate 11, inorganic photoelectric conversion sections 11B and 11R (a first photoelectric conversion sections) are provided together with the green-use electric storage layer 110G. More specifically, in the image pickup device 10, the inorganic photoelectric conversion sections 11B and 11R and the organic photoelectric conversion section 11G are layered in a vertical direction (a light path). The organic photoelectric conversion section 11G has a photoelectric conversion film 13 between a pair of electrodes (an upper electrode 14 and a lower electrode 12). Light enters the photoelectric conversion film 13 from one electrode (the upper electrode 14) side. In the organic photoelectric conversion section 11G and the inorganic photoelectric conversion sections 11B and 11R, photoelectric conversion is performed by selectively detecting light in wavelength regions different from each other. Therefore, a plurality types of color signals are obtainable by one image pickup device 10 without providing a color filter. A red color signal is obtainable in the inorganic photoelectric conversion section 11R, a blue color signal is obtainable in the inorganic photoelectric conversion section 11B, and a green color signal is obtainable in the organic photoelectric conversion section 11G.

Figure 4:
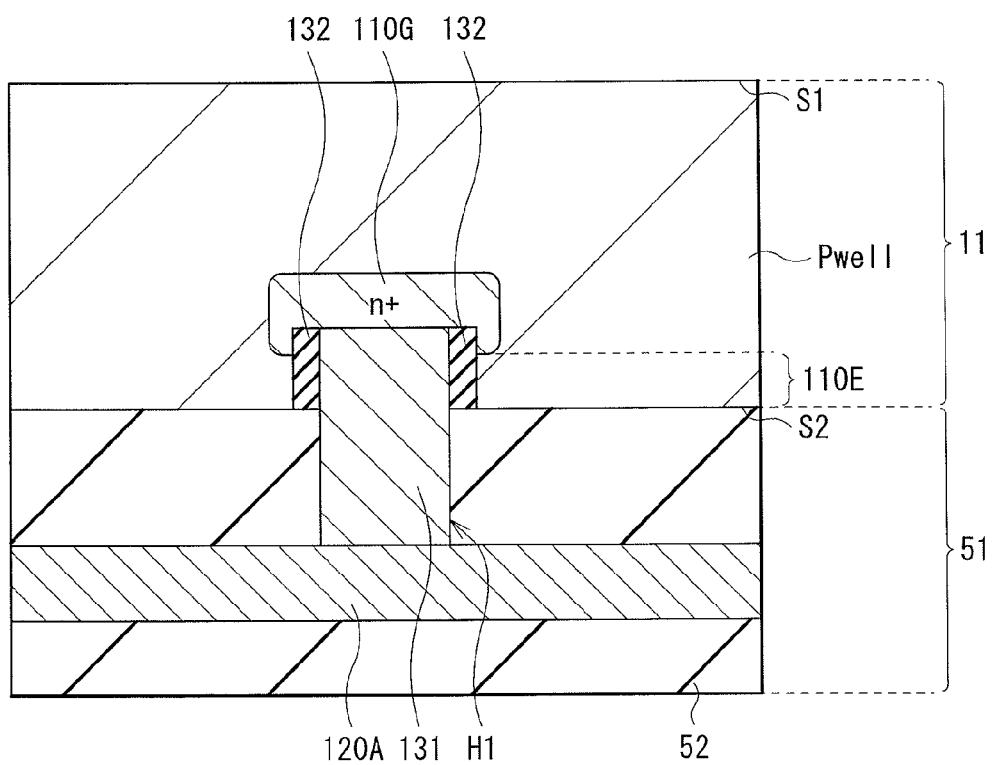
FIG. 4 is a cross-sectional view for explaining a configuration of a green-use electric storage layer illustrated in FIG. 2.

In the vicinity of the surface S2 of the semiconductor substrate 11, for example, a p-type semiconductor well region (a first conductive region, a p-type semiconductor well region $P_{well}$ of after-mentioned FIG. 4) may be provided. In the vicinity of the surface S2 of the semiconductor substrate 11, reset transistors (only a transistor Tr1 corresponding to the organic photoelectric conversion section 11G is illustrated in FIG. 1) corresponding to the organic photoelectric conversion section 11G and the inorganic photoelectric conversion sections 11B and 11R, respectively; amplification transistors (only a transistor Tr2 corresponding to the organic photoelectric conversion section 11G is illustrated in FIG. 1) corresponding to the organic photoelectric conversion section 11G and the inorganic photoelectric conversion sections 11B and 11R, respectively; and transfer transistors Tr4 and Tr5 are arranged as well. The transfer transistor Tr4 may transfer charge corresponding to blue color generated in the inorganic photoelectric conversion section 11B to, for example, a vertical signal line $L_{sig}$ (after-mentioned FIG. 34), and the transfer transistor Tr5 may transfer charge corresponding to red color generated in the inorganic photoelectric conversion section 11R to, for example, the vertical signal line $L_{sig}$. The reset transistor (the transistor Tr1), the amplification transistor (the transistor Tr2), and the transfer transistors Tr4 and Tr5 have gate electrodes GE1, GE2, GE4, and GE5, respectively. The charge may be either of an electron or a hole that are generated by photoelectric conversion. A description will be given below of a case in which an electron is read as charge (a case in which an n-type semiconductor region is a photoelectric conversion layer) as an example.

The foregoing transistor may be, for example, a MOSFET (Metal Oxide Semiconductor Field Effect Transistor), and configures a circuit for each of the photoelectric conversion sections (the organic photoelectric conversion section 11G and the inorganic photoelectric conversion sections 11B and 11R). Each circuit may have a three-transistor configuration including, for example, a transfer transistor, a reset transistor, and an amplification transistor, or may have a four-transistor configuration including a selective transistor in addition to the foregoing three transistors. The transistors other than the transfer transistor may be shared between each of the photoelectric conversion sections or between pixels.

The semiconductor substrate 11 may be made of, for example, n-type silicon (Si) (a silicon layer 110). Inside the semiconductor substrate 11, the green-use electric storage layer 110G is provided together with the foregoing inorganic photoelectric conversion sections 11B and 11R.

Figure 3:
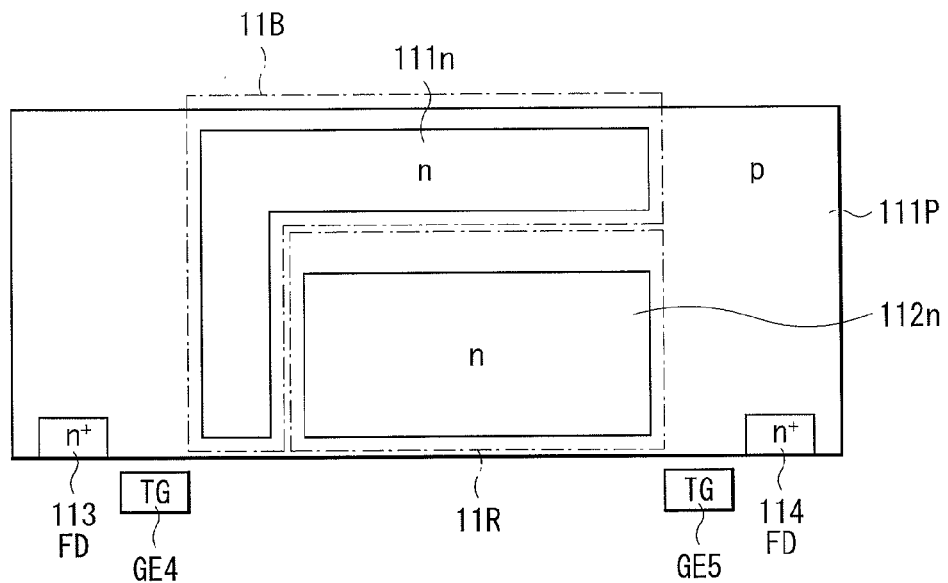
FIG. 3 is a cross-sectional view illustrating a configuration example of an inorganic photoelectric conversion section illustrated in FIG. 2.

The inorganic photoelectric conversion sections 11B and 11R are photodiodes having pn-junctions. For example, as illustrated in FIG. 3, the inorganic photoelectric conversion sections 11B and 11R may have an n-type photoelectric conversion layer (n-type region) 111n and an n-type photoelectric conversion layer 112n to become electron accumulation layers in a p-type semiconductor region (hereinafter simply called a p-type region, and the same is true on n-type) 111p. For example, the inorganic photoelectric conversion sections 11B and 11R may be arranged in this order from the surface S1 side of the semiconductor substrate 11. The n-type photoelectric conversion layer 111n is provided in a horizontal direction of the surface S1 in a predetermined region in the vicinity of the surface S1 of the semiconductor substrate 11, and part or all thereof is bent and extends in a direction perpendicular to the surface S1. In the vicinity of the surface S2 of the semiconductor substrate 11, a floating diffusion (FD113) of the blue color-use transistor Tr4 is provided (FIG. 3). The n-type photoelectric conversion layer 111n is connected to the FD113 in the n-type region.

In the vicinity of the surface S2 of the semiconductor substrate 11, a floating diffusion (FD114) of the red color-use transistor Try is provided. The n-type photoelectric conversion layer 112n is connected to the FD114 in the n-type region. A retentive capacity (a second retentive capacity) may be electrically connected to the n-type photoelectric conversion layers 111n and 112n as electron accumulation layers of the inorganic photoelectric conversion sections 11B and 11R. By providing such a retentive capacity (not illustrated) outside the semiconductor substrate 11 (for example, in the multilayer wiring layer 51), saturated charge amounts of the inorganic photoelectric conversion sections 11B and 11R are allowed to be increased.

As illustrated in FIG. 4, the green-use electric storage layer 110G is configured of an n-type region (a second conductive region) to become an electron accumulation layer. In this embodiment, the green-use electric storage layer 110G is provided in the p-type semiconductor well region $P_{well}$, and is arranged to have a separation section 110E (the p-type semiconductor well region $P_{well}$) from the surface S2 of the semiconductor substrate 11. In other words, the green-use electric storage layer 110G is separated away from the surface S2 of the semiconductor substrate 11. Although details will be described later, the foregoing configuration works to prevent a depletion layer created between the p-type region and the n-type region from being exposed on the surface S2. Therefore, a size of the depletion layer in contact with an insulating section (an after-mentioned insulating section 132) may be decreased to suppress the generation of noise.

The green-use electric storage layer 110G is connected to the conductive contact 131. The contact 131 is buried in the connection hole H1 provided from the multilayer wiring layer 51 to the semiconductor substrate 11 together with the insulating section 132. The insulating section 132 is provided in a region from the green-use electric storage layer 110G (n-type region) to the separation section 110E (p-type semiconductor well region) around the contact 131. The insulating section 132 prevents the depletion layer (a depletion layer D of aftermentioned Part (A) and Part (B) of FIG. 12) from being in contact with the contact 131, and may be made of, for example, silicon oxide. The insulating section 132 may be preferably provided on the whole surface of a side wall of the connection hole H1 and may be preferably in contact with the contact 131. However, it is enough that the insulating section 132 is formed at least in a region where the depletion layer is formed. Further, the circumference of the contact 131 may be preferably surrounded by the insulating section 132 in the semiconductor substrate 11. However, it is enough that the insulating section 132 is formed to a level at which the foregoing effect is obtainable. The contact 131 is electrically connected to the conductive plug 120a1 penetrating the semiconductor substrate 11 through the wiring 120A (the external wiring) of the multilayer wiring layer 51 and the conductive plug 120a4. Further, the conductive plug 120a1 is electrically connected to the lower electrode 12 of the organic photoelectric conversion section 11G (FIG. 1). That is, the contact 131 functions as a transmission path of signal charge (electrons) between the organic photoelectric conversion section 11G and the green-use electric storage layer 110G. The electrons transmitted from the lower electrode 12 through the foregoing path is accumulated in the green-use electric storage layer 110G. For the contact 131, for example, a metal material such as titanium, titanium nitride, and tungsten may be used. For the contact 131, polysilicon doped with n-type impurity or the like may be used as well. In the contact 131 made of the polysilicon or the like, a metal is not diffused in the semiconductor substrate 11 (the silicon layer 110), and therefore, a defective level may be prevented from occurring. A source-drain region 141 shared by the transistors Tr1 and Tr2, and a source-drain region 142 of the transistor Tr2 are also provided in the vicinity of the surface S2 of the semiconductor substrate 11.

A conductive plug 180b1 (FIG. 2) functions as a transmission path of a hole generated in the organic photoelectric conversion section 11G. The hole is ejected from the upper electrode 14 of the organic photoelectric conversion section 11G through the conductive plug 180b1. The conductive plug 180b1 is buried in the semiconductor substrate 11 together with the conductive plug 120a1. The conductive plugs 120a1 and 180b1 may be configured of, for example, conductive semiconductor layers, and are buried in the semiconductor substrate 11. The conductive plug 120a1 may be preferably made of an n-type semiconductor, since the conductive plug 120a1 becomes an electron transmission path. In contrast, the conductive plug 180b1 may be preferably made of a p-type semiconductor, since the conductive plug 180b1 becomes a hole transmission path. Alternatively, the conductive plugs 120a1 and 180b1 may be formed by burying a conductive material such as tungsten in a through via. In the conductive plugs 120a1 and 180b1, in order to suppress a short-circuit with respect to silicon, side surfaces of the vias are covered with an insulating film (an insulating section 1201 of FIG. 1) such as silicon oxide (SiO$_2$) and silicon nitride (SiN).

The multilayer wiring layer 51 has a plurality of wirings 51a and the wiring 120A through an interlayer insulating film 52. The interlayer insulating film 52 is in contact with the surface S2 of the semiconductor substrate 11 (FIG. 2). The conductive plug 120a4, the contact 131, and a conductive plug 120a5 (FIG. 1) are electrically connected to the wiring 120A. The conductive plug 120a5 electrically connects the transistor Tr2 (the gate electrode GE2) to the green-use electric storage layer 110G through the wiring 120A. The multilayer wiring layer 51 may be bonded to a support substrate 53 made of silicon, and the multilayer wiring layer 51 may be arranged between the support substrate 53 and the semiconductor substrate 11.

In the organic photoelectric conversion section 11G located outside the semiconductor substrate 11, the photoelectric conversion film 13 absorbs light (green light in this example) with a selective wavelength to generate an electron-hole pair. Signal charge generated in the photoelectric conversion film 13 is extracted from the upper electrode 14 and the lower electrode 12. The lower electrode 12 is electrically connected to the conductive plug 120a1 in the semiconductor substrate 11 through the conductive plugs 120a3 and 120a2. The upper electrode 14 is electrically connected to the conductive plug 180b1 in the semiconductor substrate 11 through the contact metal layer 18, the wiring 18A, and the conductive plugs 180b3 and 180b2. The organic photoelectric conversion section 11G is arranged in a position opposed to the inorganic photoelectric conversion sections 11B and 11R in the semiconductor substrate 11, that is, is arranged directly above the inorganic photoelectric conversion sections 11B and 11R.

The photoelectric conversion film 13 is made of an organic semiconductor material, photoelectrically converts green color light, and transmits light in other wavelength regions. For the photoelectric conversion film 13, either one of an organic p-type semiconductor and an organic n-type semiconductor may be used. However, both the organic p-type semiconductor and the organic n-type semiconductor may be preferably included therein. As the organic p-type semiconductor and the organic n-type semiconductor, for example, any of a quinacridone derivative, a naphthalene derivative, an anthracene derivative, a phenanthrene derivative, a tetracene derivative, a pyrene derivative, a perylene derivative, and a fluoranthene derivative may be preferably used. A polymer such as phenylenevinylene, fluorene, carbazole, indole, pyrene, pyrrole, picoline, thiophene, acetylene, and diacetylene, or a derivative thereof may be used. A metal complex pigment, a cyanine-based pigment, a merocyanine-based pigment, a phenyl xanthene-based pigment, a triphenylmethane-based pigment, a rhodacyanine-based pigment, a xanthene-based pigment, a macrocyclic azaannulene-based pigment, an azulene-based pigment, naphthoquinone, or an anthraquinone-based pigment may be used. As the metal complex pigment, a dithiol metal complex-based pigment, a metal phthalocyanine pigment, a metal porphyrin pigment, and a ruthenium complex pigment may be preferably used, and the ruthenium complex pigment may be particularly preferable. The photoelectric conversion film 13 may be configured of a condensed polycyclic aromatic such as anthracene and pyrene, or a chain compound formed by condensing an aromatic ring or a heterocyclic compound. A compound formed by binding two or more nitrogen-containing heterocycles such as quinolone, benzothiazole, and benzooxazole with the use of a squarylium group and a chroconic methine group as a binding chain; a pigment similar to cyanine bound through a squarylium group and a chroconic methine group, or the like may be used. A plurality of layers (such as an undercoat film, an electron blocking layer, a hole blocking layer, a buffer layer, and a work function adjustment layer) may be provided between the lower electrode 12 and the upper electrode 14.

The lower electrode 12 extracts signal charge (electrons) generated in the photoelectric conversion film 13, and is electrically connected to the green-use electric storage layer 110G through the conductive plug 120a1. As described above, the lower electrode 12 is provided in a position opposed to the light receiving surfaces of the inorganic photoelectric conversion sections 11B and 11R, that is, is arranged directly above the inorganic photoelectric conversion sections 11B and 11R. Therefore, the lower electrode 12 may be made of a light transmissive conductive material such as ITO (Indium-Tin-Oxide). The lower electrode 12 may be made of, for example, a tin oxide ($SnO_2$)-based material or a zinc oxide (ZnO)-based material. The tin oxide-based material is formed by adding a dopant to tin oxide. Examples of the zinc oxide-based material may include an aluminum zinc oxide (AZO) formed by adding aluminum (Al) as a dopant to zinc oxide, a gallium zinc oxide (GZO) formed by adding gallium (Ga) as a dopant to zinc oxide, and an indium zinc oxide (IZO) formed by adding indium (In) as a dopant to zinc oxide. In addition thereto, IGZO, CuI, $InSbO_4$, ZnMgO, $CuInO_2$, $MgIn_2O_4$, CdO, $ZnSnO_3$, or the like may be used.

The conductive plug 180b1 is electrically connected to the upper electrode 14. Holes generated in the photoelectric conversion film 13 are ejected through a resultant path thereof. The upper electrode 14 may be made of a similar light transmissive conductive material as the lower electrode 12. In the image pickup device 10, the holes extracted from the upper electrode 14 are ejected. Therefore, at the time of arranging a plurality of image pickup devices 10 (for example, an image pickup unit 1 of after-mentioned FIG. 34), the upper electrode 14 may be provided commonly to the respective image pickup devices 10 (a pixel P of FIG. 34). The thickness of the upper electrode 14 may be, for example, from 10 nm to 200 nm both inclusive.

Interlayer insulating films 15 and 16 lie between the organic photoelectric conversion section 11G and the surface S1 of the semiconductor substrate 11. The interlayer insulating film 15 in contact with the surface S1 of the semiconductor substrate 11 may preferably decrease an interface state with respect to the semiconductor substrate 11 (the silicon layer 110), and may preferably suppress generation of a dark current from the interface with respect to the silicon layer 110. As a material of the interlayer insulating film 15, a material with a small interface state may be suitable, and for example, a laminated film of hafnium oxide ($HfO_2$) and silicon oxide ($SiO_2$) may be preferably used. The interlayer insulating film 15 has through-holes in positions opposed to the conductive plugs 120a1 and 180b1 in the semiconductor substrate 11. The conductive plugs 120a2 and 180b2 are provided in the through-holes. The conductive plugs 120a2 and 180b2 may preferably function as a light shielding section as well, and may be configured of, for example, a laminated film made of a conductive material having a light shielding function such as a metal material such as titanium (Ti), titanium nitride (TiN), and tungsten (W). In the case where the foregoing laminated film is used, even if the conductive plugs 120a1 and 180b1 are formed of an n-type semiconductor or a p-type semiconductor, contact with silicon is allowed to be secured.

The interlayer insulating film 16 layered on the interlayer insulating film 15 may be configured of a single layer film made of, for example, silicon oxide, silicon nitride, silicon oxynitride (SiON), or the like, or a laminated film made of two or more thereof. The conductive plugs 120a3 and 180b3 that are electrically connected to the conductive plugs 120a2 and 180b2 are buried in the interlayer insulating film 16.

The lower electrode 12 is provided on the interlayer insulating film 16. The wiring 18A electrically connected to the upper electrode 14 is provided in the same layer as that of the lower electrode 12. An insulating film 17 is provided between the lower electrode 12 and the wiring 18A. For example, a diameter of an opening of the insulating film 17 may become smaller (tapered) as the position thereof becomes closer to the lower electrode 12 side. The organic photoelectric conversion section 11G is arranged in the opening of the insulating film 17. The insulating film 17 may be configured of a single layer film made of, for example, silicon oxide, silicon nitride, silicon oxynitride, or the like, or a laminated film made of two or more thereof. The wiring 18A electrically connects a contact metal layer 18 to the conductive plugs 180b2 and 180b3. Alternatively, the contact metal layer 18 may be directly connected to the conductive plugs 180b2 and 180b3 without providing the wiring 18A.

A connection hole H2 is provided in a protective film 19 covering the upper electrode 14. The upper electrode 14 is electrically connected to the contact metal layer 18 through the connection hole H2 (FIG. 2). The contact metal layer 18 covers the connection hole H2, and is electrically connected to the wiring 18A via through holes of the protective film 19 and the insulating film 17. The protective film 19 has light transparency, and may be configured of a single layer film made of, for example, silicon nitride, silicon oxide, silicon oxynitride, or the like, or a laminated film made thereof. The thickness of the protective film 19 may be, for example, from 100 nm to 300 nm both inclusive. For the contact metal layer 18, for example, any of titanium, tungsten, titanium nitride, aluminum, and the like may be used, or two or more thereof may be used.

A sealing film 21 is provided to cover the whole surfaces of the contact metal layer 18 and the protective film 19. Further, an on-chip lens 22 is provided on the sealing film 21. The sealing film 21 suppresses variations in characteristics of the organic photoelectric conversion section 11G from being influenced by moisture, oxygen, hydrogen, and/or the like. For example, the sealing film 21 may be made of light-transmissive silicon nitride, silicon oxynitride, aluminum oxide, or the like. Alternatively, the sealing film 21 may be formed by laminating a plurality of films.

The on-chip lens 22 focuses light entering from above on the light receiving surfaces of the organic photoelectric conversion section 11G and the inorganic photoelectric conversion sections 11B and 11R. In the backside-illumination type image pickup device 10, a distance between the on-chip lens 22 and the light receiving surfaces of the inorganic photoelectric conversion sections 11B and 11R is decreased. Therefore, variation of sensitivity of each color generated depending on an F value of the on-chip lens 22 may be suppressed. The on-chip lens 22 has a planarizing section 22A to infill concavity and convexity with respect to the sealing film 21 and a lens section 22B on the planarizing section 22A. The on-chip lens 22 may be made of, for example, a material in which a difference between a refractive index of the material of the on-chip lens 22 and a refractive index of the material of the sealing film 21 is equal to or less than 0.1. Thereby, reflection at the interface between the sealing film 21 and the on-chip lens 22 is suppressed, and the efficiency of focusing light may be improved. Specifically, for the on-chip lens 22, a material similar to that of the sealing film 21 such as light-transmissive silicon nitride, silicon oxynitride, and aluminum oxide may be used. More specifically, a function of the sealing film 21 may be improved by the on-chip lens 22. Further, since the sealing film 21 is allowed to be thinned, the thickness of the image pickup device 10 may be decreased as well.

[Method of Manufacturing Image Pickup Device 10]

The foregoing image pickup device 10 may be manufactured, for example, as follows (FIG. 5A to FIG. 9B).

Figure 5A:
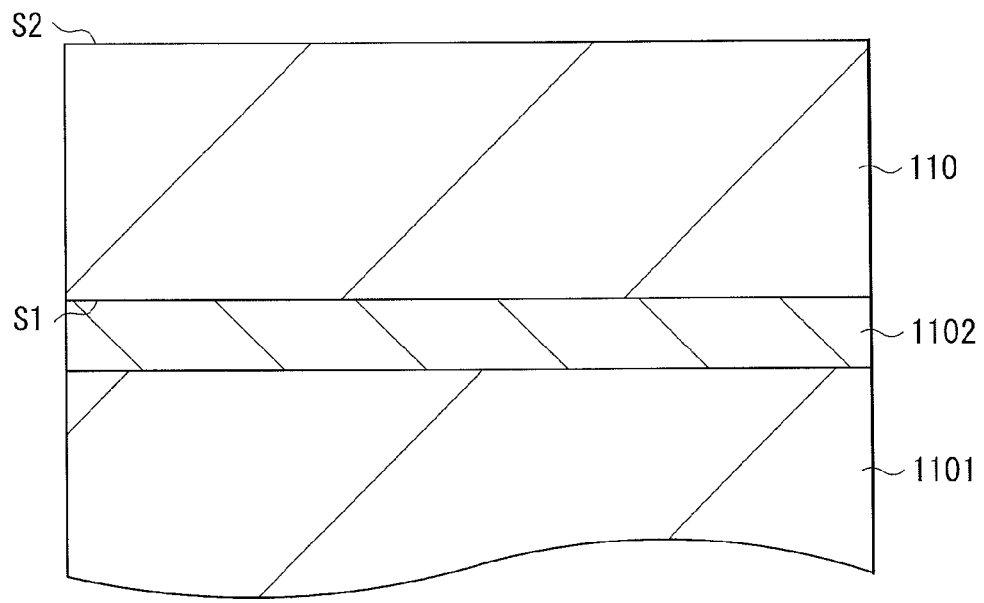
FIG. 5A is a cross-sectional view illustrating an example of a step of manufacturing the image pickup device illustrated in FIG. 2.
Figure 5B:
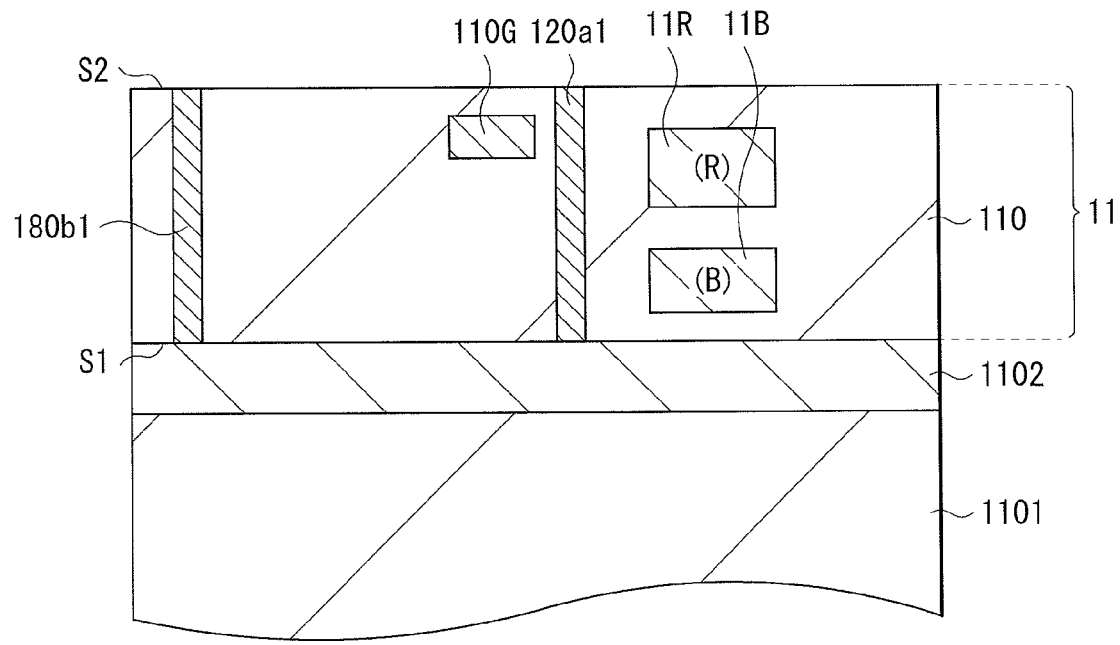
FIG. 5B is a cross-sectional view illustrating a step following the step of FIG. 5A.

First, for example, the semiconductor substrate 11 may be formed as follows. First, as illustrated in FIG. 5A, a substrate (a so-called SOI substrate) having a silicon oxide film 1102 between a silicon substrate 1101 and the silicon layer 110 is prepared. The conductive plugs 120a1 and 180b1 are formed in the silicon layer 110. In the silicon layer 110, the surface in contact with the silicon oxide film 1102 becomes the surface S1 of the semiconductor substrate 11. The conductive plugs 120a1 and 180b1 may be formed by, for example, forming through vias in the silicon layer 110, and filling an insulating film such as silicon nitride and tungsten in the through vias. Alternatively, as the conductive plugs 120a1 and 180b1, conductive impurity semiconductor layers may be formed by implanting ions into the silicon layer 110. Next, the inorganic photoelectric conversion sections 11B and 11R are formed in regions having different depths in the silicon layer 110 so that the inorganic photoelectric conversion sections 11B and 11R are superposed each other. The green-use electric storage layer 110G is formed in the p-type semiconductor well region by ion implantation together with the inorganic photoelectric conversion sections 11B and 11R. In the vicinity of the surface S2 of the semiconductor substrate 11, transistors such as the transistors Tr1, Tr2, Tr4, and Tr5 and a peripheral circuit such as a logic circuit are provided (FIG. 5B). Thereby, the semiconductor substrate 11 is formed.

Figure 6A:
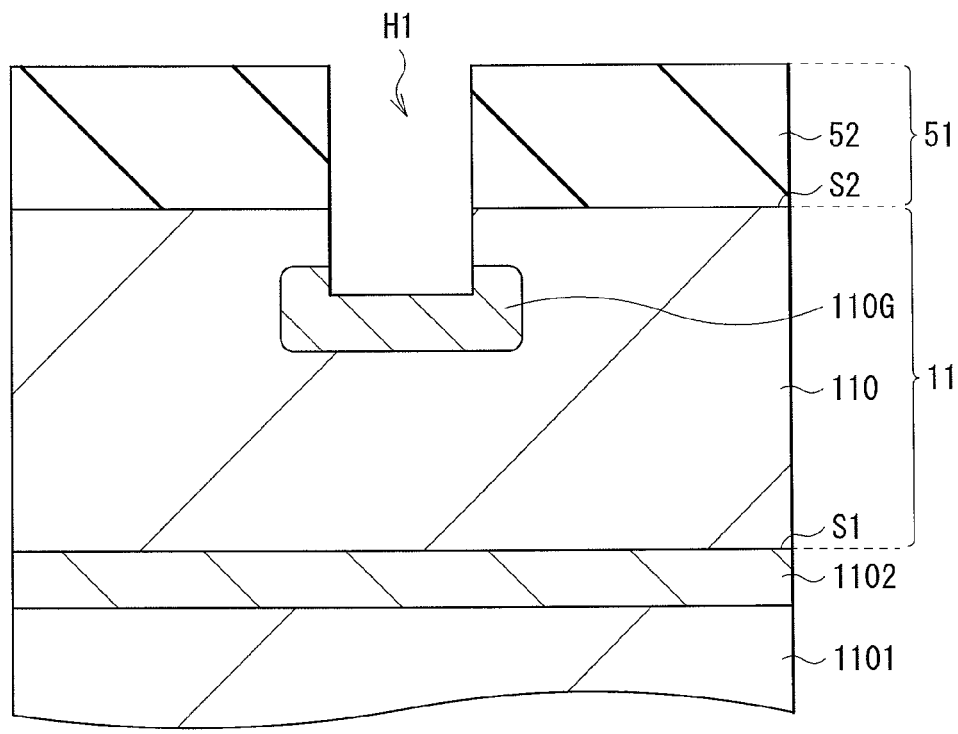
FIG. 6A is a cross-sectional view illustrating a step following the step of FIG. 5B.
Figure 6B:
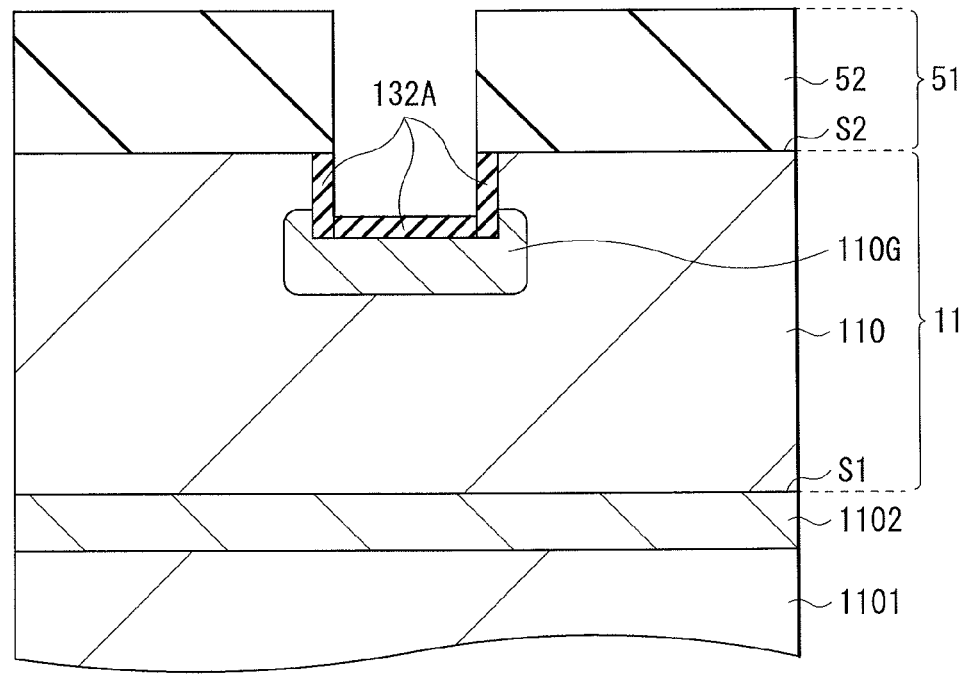
FIG. 6B is a cross-sectional view illustrating a step following the step of FIG. 6A.

Subsequently, the multilayer wiring layer 51 is formed on the surface S2 of the semiconductor substrate 11. In the multilayer wiring layer 51, the plurality of wirings 51a (FIG. 2) and the wiring 120A (FIG. 1) are provided through the interlayer insulating film 52. At this time, the contact 131 connected to the green-use electric storage layer 110G is formed together with the wirings 51a and the wiring 120A. Specifically, as illustrated in FIG. 6A, first, after the connection hole H1 extending from the multilayer wiring layer 51 to the green-use electric storage layer 110G is formed, an insulating film 132A is provided from the side wall to the bottom surface of the connection hole H1 (FIG. 6B). The insulating film 132A is used for forming the insulating section 132 covering the circumference of the contact 131. For example, silicon oxide may be formed by thermally oxidizing the semiconductor substrate 11 (the silicon layer 110). In the insulating film 132A formed by the foregoing oxidation, a defective level of an interface between silicon and silicon oxide is decreased. Therefore, even if a depletion layer (the depletion layer D of after-mentioned Part (A) and Part (B) of FIG. 12) generated between the p-type semiconductor well region (the separation section 110E) and the n-type region (the green-use electric storage layer 110G) is in contact with the insulating section 132 (the insulating film 132A), generation of noise is allowed to be prevented. The insulating film 132A may be formed by, for example, forming a film with the use of a plasma CVD (Chemical Vapor Deposition) method and/or the like.

Figure 7A:
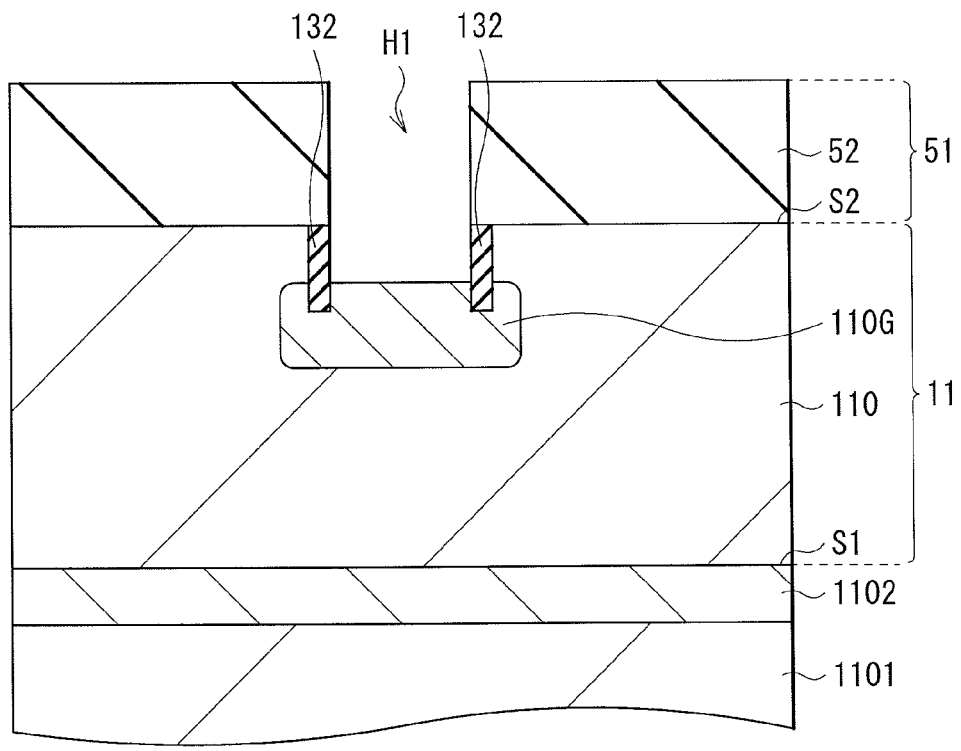
FIG. 7A is a cross-sectional view illustrating a step following the step of FIG. 6B.
Figure 7B:
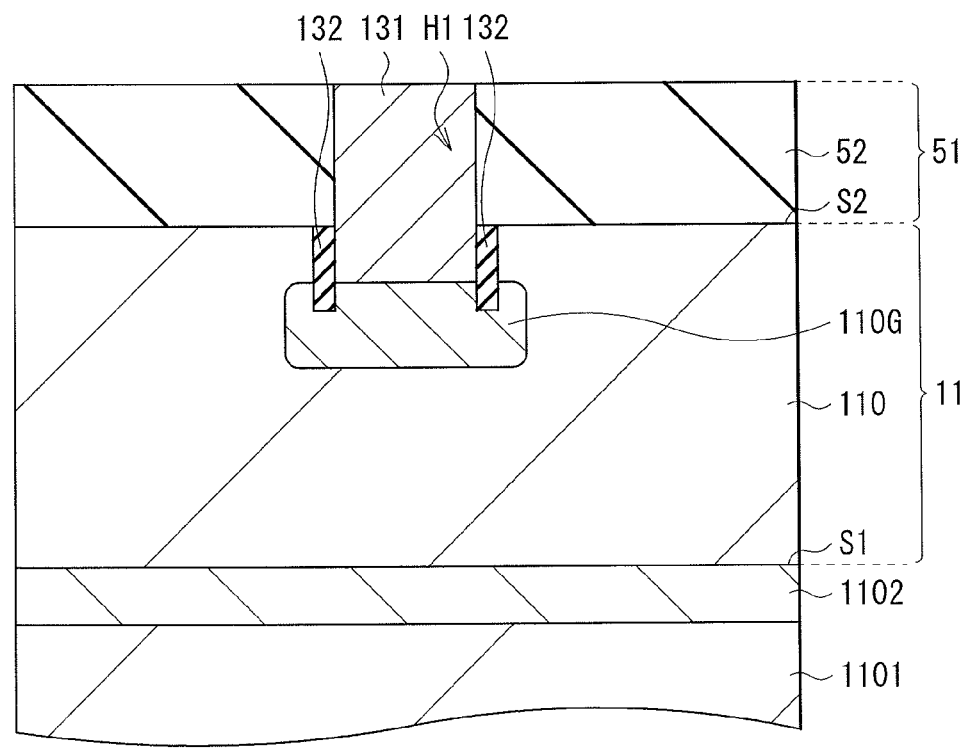
FIG. 7B is a cross-sectional view illustrating a step following the step of FIG. 7A.

After the insulating film 132A is provided, as illustrated in FIG. 7A, the insulating film 132A on the bottom surface of the connection hole H1 may be removed by, for example, anisotropic etching to form the insulating section 132. Thereafter, a metal material such as titanium, titanium nitride, and tungsten is buried in the connection hole H1 to form the contact 131 (FIG. 7B).

Next, after the support substrate 53 (FIG. 2) is bonded to the multilayer wiring layer 51, the silicon oxide film 1102 and the silicon substrate 1101 are peeled off from the silicon layer 110 to expose the surface S1 of the silicon layer 110. Thereafter, a hafnium oxide film may be formed on the surface S1 of the semiconductor substrate 11 by, for example, an atomic layer deposition (ALD) method, and a silicon oxide film is formed thereon by a plasma CVD method to form the interlayer insulating film 15.

Subsequently, connection holes are provided in positions that are opposed to the conductive plugs 120a1 and 180b1, respectively in the interlayer insulating film 15. Thereafter, a conductive film is formed on the interlayer insulating film 15 to fill a conductive material in the connection holes. Thereby, the conductive plugs 120a2 and 180b2 are formed. At this time, the conductive plugs 120a2 and 180b2 may be formed to extend to a region where light is desirably blocked. Alternatively, a light shielding layer may be formed in a location away from the conductive plugs 120a2 and 180b2.

Next, the interlayer insulating film 16 may be formed on the conductive plugs 120a2 and 180b2 and the interlayer insulating film 15 by, for example, a plasma CVD method. The surface of the interlayer insulating film 16 may be preferably planarized by, for example, a CMP (Chemical Mechanical Polishing) method. Thereafter, contact holes are provided in positions that are opposed to the conductive plugs 120a2 and 180b2 in the interlayer insulating film 16 to fill a conductive material therein. Thereby, the conductive plugs 120a3 and 180b3 are formed. At the time of forming the conductive plugs 120a3 and 180b3, an extra portion of the conductive material remaining on the interlayer insulating film 16 may be preferably removed by, for example, a CMP method.

Subsequently, the lower electrode 12 is formed on the interlayer insulating film 16. The lower electrode 12 may be formed by forming an ITO film by, for example, a sputtering method, and subsequently patterning the ITO film by a photolithography technique to perform dry etching or wet etching. The wiring 18A may be formed together with the lower electrode 12, or may be formed by a step different from that of the lower electrode 12. After the lower electrode 12 and the wiring 18A are formed, the insulating film 17 is formed.

Next, the photoelectric conversion film 13 is formed on the lower electrode 12. The photoelectric conversion film 13 may be formed by, for example, patterning by a vacuum evaporation method with the use of a metal mask, or may be patterned concurrently with forming the upper electrode 14. Subsequently, ITO may be formed on the photoelectric conversion film 13 by, for example, a vacuum evaporation method to form the upper electrode 14. Characteristics of the photoelectric conversion film 13 may be changed by being influenced by moisture, oxygen, hydrogen, and/or the like. Therefore, the upper electrode 14 may be preferably formed continuously after formation of the photoelectric conversion film 13 while a vacuum state is maintained. The upper electrode 14 may be formed by a sputtering method and/or the like. Before the upper electrode 14 is patterned, the protective film 19 may be formed on the upper electrode 14 by, for example, a plasma CVD method. Subsequently, patterning by a photolithography technique and dry etching are performed on the protective film 19 and the upper electrode 14. Finally, a deposited material and a residue are removed by post-treatment such as ashing and organic cleaning.

Figure 8A:
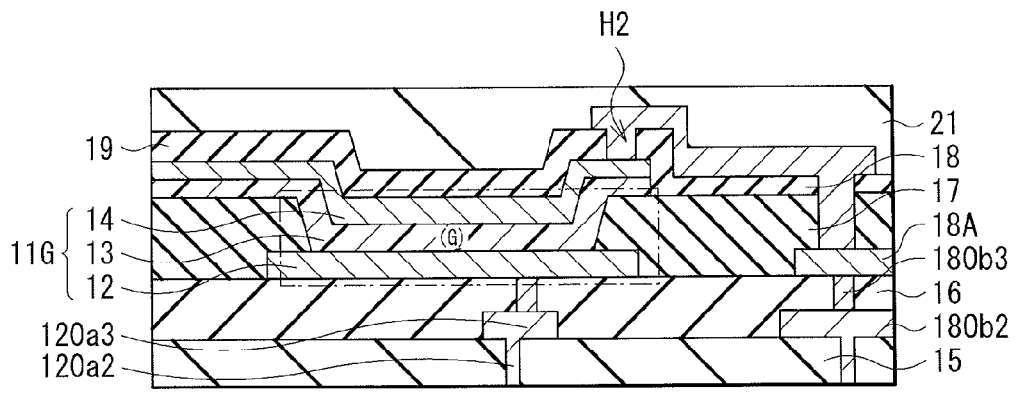
FIG. 8A is a cross-sectional view illustrating a step following the step of FIG. 7B.

After the protective film 19 is patterned, the connection hole H2 is provided in a position opposed to the upper electrode 14 in the protective film 19 to form the contact metal layer 18 in a region from the connection hole H2 to the wiring 18A. Subsequently, as illustrated in FIG. 8A (in the figure, the semiconductor substrate 11, the multilayer wiring layer 51, and the support substrate 53 are not illustrated, and the same is applied to after-mentioned FIGS. 8B, 9A, and 9B), the sealing film 21 is formed on the whole surface of the semiconductor substrate 11 (the surface S1). The sealing film 21 may be formed by forming a film made of silicon nitride, silicon oxynitride, aluminum oxide, or the like by, for example, a CVD method, an ALD method, or the like.

Figure 8B:
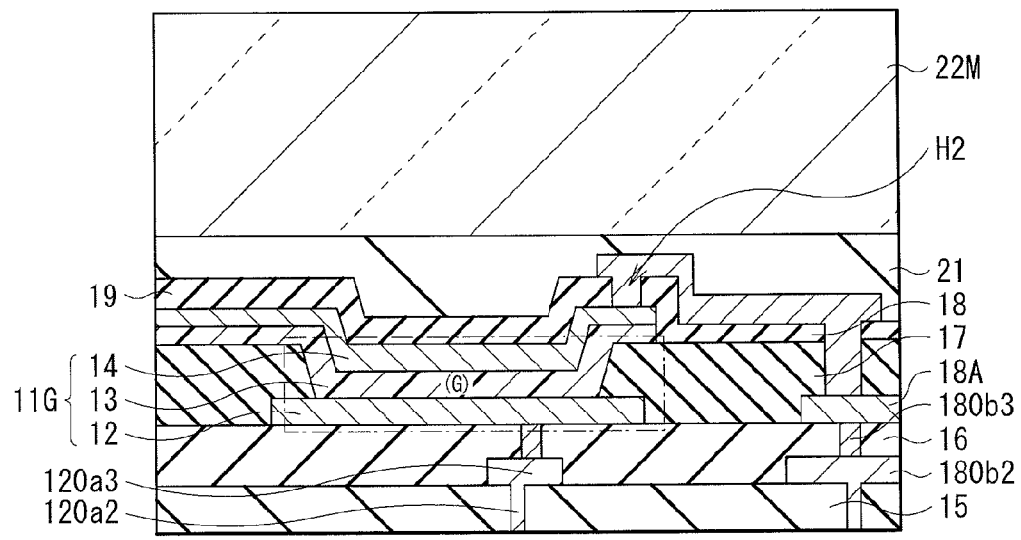
FIG. 8B is a cross-sectional view illustrating a step following the step of FIG. 8A.
Figure 9A:
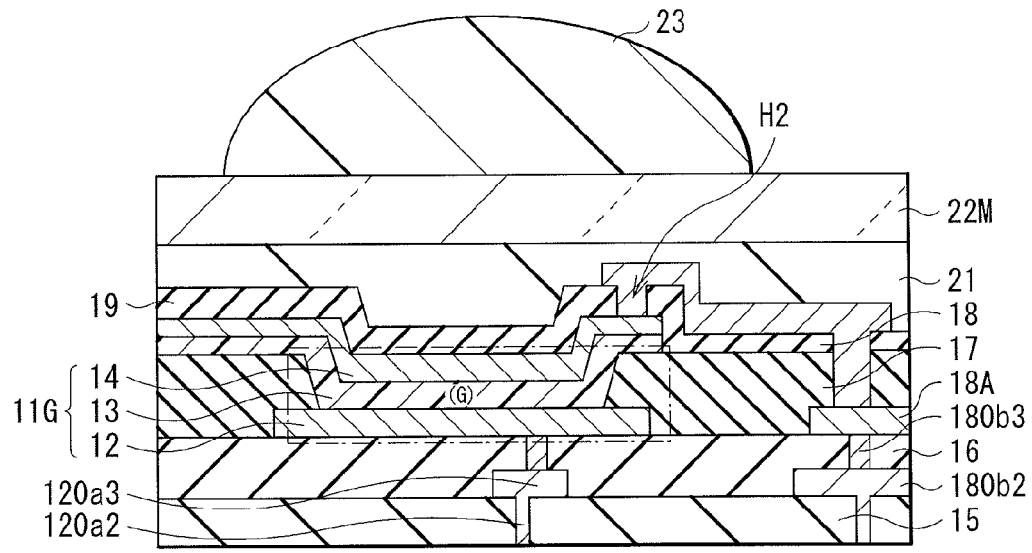
FIG. 9A is a cross-sectional view illustrating a step following the step of FIG. 8B.
Figure 9B:
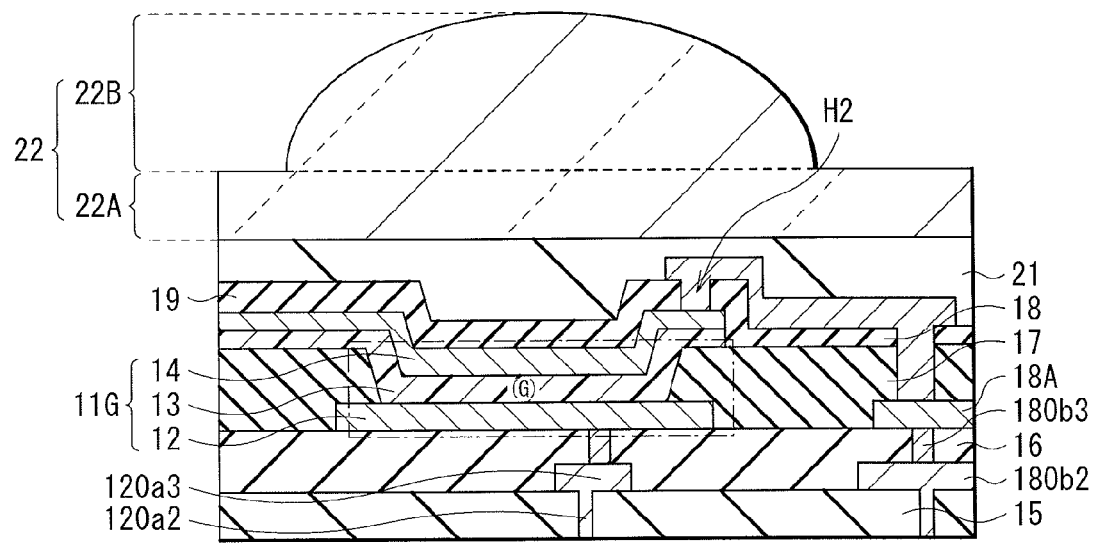
FIG. 9B is a cross-sectional view illustrating a step following the step of FIG. 9A.

Next, as illustrated in FIG. 8B, a lens material film 22M may be formed on the sealing film 21 by, for example, the CVD method, the ALD method, or the like. The lens material film 22M is used to form the on-chip lens 22, and may preferably have refractive index nearly equal to that of a constituent material of the sealing film 21 (a difference between respective refractive indexes is equal to or less than 0.1). For the lens material film 22M, for example, the same material as the constituent material of the sealing film 21 is used. Next, a resist 23 for patterning the lens material film 22M is provided on the lens material film 22M (FIG. 9A). Thereafter, etching is performed to form the planarizing section 22A and the lens section 22B of the on-chip lens 22 (FIG. 9B). The resist 23 may be formed by, for example, a lithography technique, a reflow treatment, and/or the like. By the foregoing steps, the image pickup device 10 illustrated in FIG. 1 and FIG. 2 is completed.

[Operation of Pickup Device 10]

Figure 10:
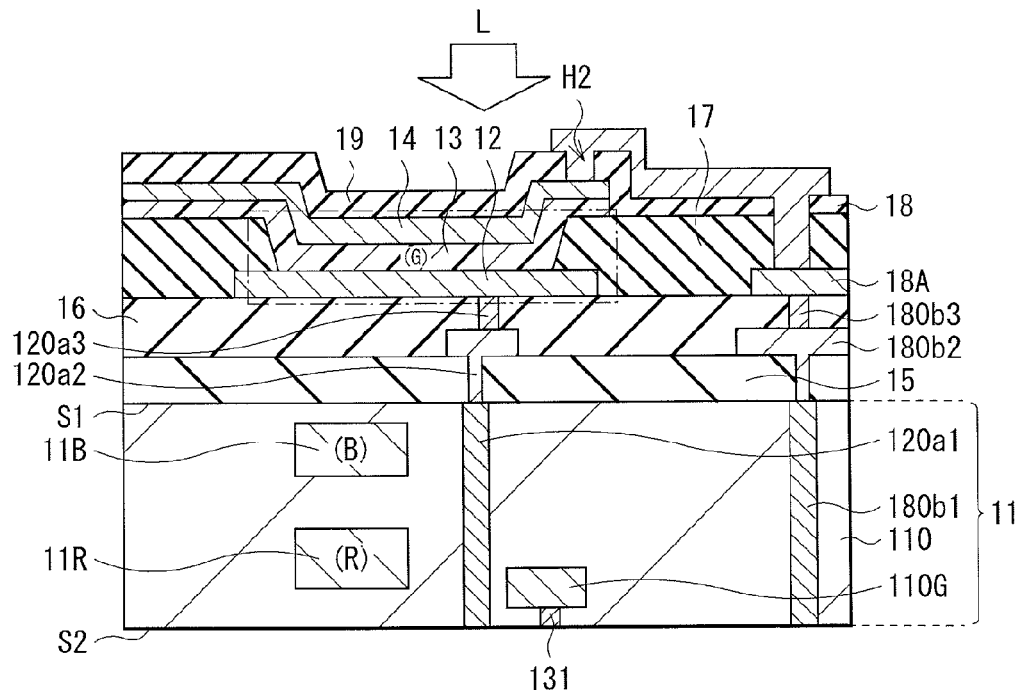
FIG. 10 is a cross-sectional view for explaining an operation of the image pickup device illustrated in FIG. 2.
Figure 11:
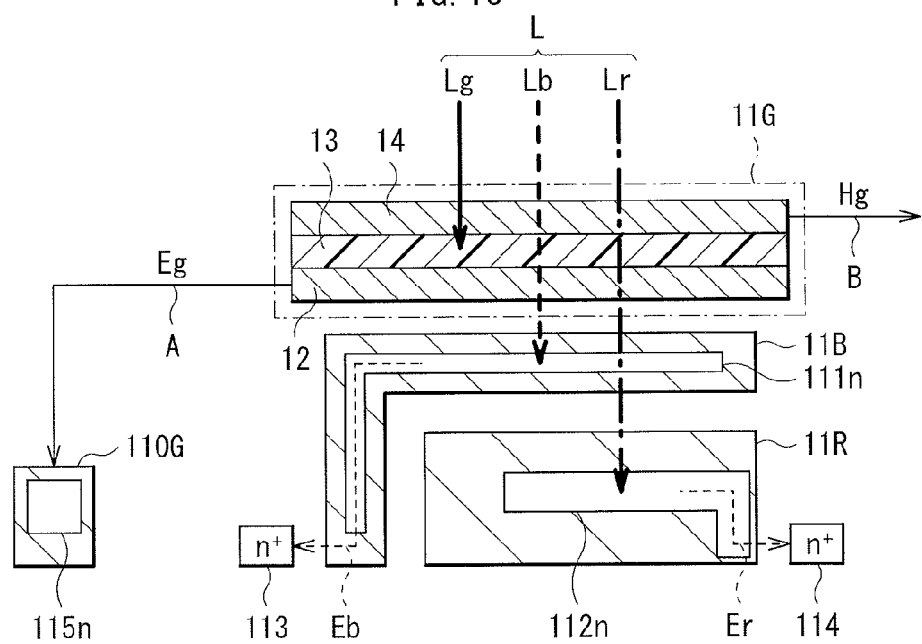
FIG. 11 is a pattern diagram for explaining an operation of the image pickup device illustrated in FIG. 10.

In the image pickup device 10, for example, for a pixel of an image pickup unit, the signal charge (electron) is obtained as follows. When light L (FIG. 10) enters the image pickup device 10 through the on-chip lens 22 (FIG. 2), the light L passes through the organic photoelectric conversion section 11G, the inorganic photoelectric conversion section 11B, and the inorganic photoelectric conversion section 11R in order. In the course of the foregoing passage, photoelectric conversion is performed for each of green, blue, and red color light. More specifically, as illustrated in FIG. 11, out of the light L entering the image pickup device 10, first, green light Lg is selectively detected (absorbed) at the organic photoelectric conversion section 11G, and is photoelectrically converted. An electron Eg of an electron-hole pair generated in the organic photoelectric conversion section 11G is extracted from the lower electrode 12, and is accumulated in the green-use electric storage layer 110G through a transmission path A (the conductive plugs 120a3, 120a2, 120a1, and 120a4, the wiring 120A, and the contact 131). The green-use electric storage layer 110G may be formed, function as a floating diffusion (FD), and is connected to an amplification transistor. In contrast, a hole Hg is ejected from the upper electrode 14 through a transmission path B (the contact metal layer 18, the wiring 18A, and the conductive plugs 180b3, 180b2, and 180b1).

Electric potential is changed by the electron Eg accumulated in the green-use electric storage layer 110G. The change of the electric potential is amplified by the amplification transistor Tr2, and the resultant is read into a vertical signal line $L_{sig}$ (after-mentioned FIG. 34). As described above, a green signal based on a light receiving amount of the green light Lg is read into the vertical signal line $L_{sig}$. Thereafter, the reset transistor Tr1 transitions to an on-state, and the electric storage region (n-type region) of the green-use electric storage layer 110G may be reset to, for example, an electric power source voltage VDD.

Out of the light passing though the organic photoelectric conversion section 11G, blue light is absorbed into the inorganic photoelectric conversion section 11B, and red light is absorbed into the inorganic photoelectric conversion section 11R, and absorbed light is photoelectrically converted. In the inorganic photoelectric conversion section 11B, an electron Eb corresponding to the incident blue light is accumulated in the n-type region (the n-type photoelectric conversion layer 111n). The accumulated electron Eb is transferred to the FD113 at the time of reading operation. At this time, a hole generated in the inorganic photoelectric conversion section 11B is ejected into the p-type region (not illustrated in FIG. 11). The same is applied to the inorganic photoelectric conversion section 11R. In the inorganic photoelectric conversion section 11R, an electron Er corresponding to the incident red color light is accumulated in the n-type region (the n-type photoelectric conversion layer 112n). The accumulated electron Er is transferred to the FD114 at the time of reading operation. At this time, a hole generated in the inorganic photoelectric conversion section 11R is ejected into the p-type region (not illustrated in FIG. 11).

Reading operations of the inorganic photoelectric conversion sections 11B and 11R may be performed, for example, as follows. The transfer transistors Tr4 and Tr5 transition to an on-state, and the electrons Eb and Er accumulated in the n-type photoelectric conversion layers 111n and 112n are transferred to the FDs 113 and 114 (FIG. 3A and FIG. 3B). Thereby, a blue color signal based on a light receiving amount of blue color light Lb and a red color signal based on a light receiving amount of red color light Lr may be read into the vertical signal line $L_{sig}$ (after-mentioned FIG. 34) through, for example, the amplification transistor. Thereafter, the reset transistor and the transfer transistors Tr4 and Tr5 are in on-state, and the FDs 113 and 114 as the n-type regions may be reset to, for example, the electric power source voltage VDD.

[Function and Effect of Image Pickup Device 10]

By layering the organic photoelectric conversion section 11G and the inorganic photoelectric conversion sections 11B and 11R in the vertical direction as described above, red color light, green color light, and blue color light are allowed to be separated and detected to obtain signal charge of each color without providing a color filter. Therefore, light loss (lowered sensitivity) resulting from color light absorption by the color filter and false color associated with pixel interpolation processing may be suppressed.

In the image pickup device 10, as illustrated in Part (A) and Part (B) of FIG. 12, the separation section 110E is provided between the surface S2 of the semiconductor substrate 11 and the green-use electric storage layer 110G. Therefore, generation of noise when signal charge is shifted between the organic photoelectric conversion section 11G (FIG. 2) outside the semiconductor substrate 11 and the green-use electric storage layer 110G inside the semiconductor substrate 11 may be suppressed. The description will be provided of a mechanism for this.

Noise at the time of shifting of signal charge results from the depletion layer D (FIG. 13) mainly generated between the p-type region P and the n-type region N. The larger a charge amount generated in the depletion layer D is, the larger the noise becomes. The charge amount of the depletion layer D is affected by a defective level in the depletion layer D or a defective level in a film in contact with the depletion layer D. In particular, in the case where the depletion layer D is in contact with an insulating film such as silicon oxide, a large amount of defective levels are generated, resulting in a main factor of noise generation.

Part (A) and Part (B) of FIG. 14 illustrate a configuration of a contact (a contact 1130) of an image pickup device according to a comparative example. In this image pickup device, a green-use electric storage layer 1110G is in contact with the surface S2 of a semiconductor substrate 1111, and does not have a separation section. Therefore, the depletion layer D between the green-use electric storage layer 1110G (n-type region) and a p-type semiconductor well region is in contact with the interlayer insulating film 52 of the multilayer wiring layer 151 at the surface S2 of the semiconductor substrate 1111. Thereby, a large amount of noise is generated.

A charge amount of the depletion layer D, that is, an amount of noise also varies according to size (an area or a cubic volume) of the depletion layer D. As the depletion layer D is decreased, noise may be further decreased. More specifically, an amount of noise also varies according to an outer circumference L2 of the green-use electric storage layer 1110G (n-type region) and a width W2 of the depletion layer D. Therefore, in the case where the outer circumference L2 of the green-use electric storage layer 1110G (n-type region) is decreased, a contact area between the depletion layer D and the interlayer insulating film 52 is decreased, and thereby, noise may be decreased. However, as illustrated in FIG. 15, as a formation region of the green-use electric storage layer 1110G is decreased (as the p-type region is increased), the contact 1130 becomes close to the depletion layer D, and therefore, a defective level resulting from the structure of the contact 1130 becomes close to the depletion layer D, resulting in generation of noise. Further, in the case where the contact 1130 is in contact with the depletion layer D of p-n junction, a leak of the p-n junction through the contact 1130 may occur. Therefore, it is necessary that the outer circumference L2 of the green-use electric storage layer 1110G is larger than the outer circumference of the contact 1130.

In contrast, in the image pickup device 10, the separation section 110E is provided between the surface S2 of the semiconductor substrate 11 and the green-use electric storage layer 110G. Therefore, the depletion layer D is not in contact with the interlayer insulating film 52 of the multilayer wiring layer 51 (Part (A) and Part (B) of FIG. 12). Therefore, the depletion layer D is not affected by the interlayer insulating film 52, an amount of generated noise depends on an area in contact with the depletion layer D of the insulating section 132 in the connection hole H1. More specifically, an amount of noise is determined by an outer circumference L1 of the insulating section 132 and a width W1 of the depletion layer D. The insulating section 132 is in contact with the contact 131, and the outer circumference L1 of the insulating section 132 is substantially equal to the outer circumference of the contact 131 (however, the outer circumference L1 is larger than the outer circumference of the contact 131 by the thickness of the insulating section 132). The outer circumference L1 of the insulating section 132 is smaller than the outer circumference L2 of the green-use electric storage layer 1110G. Therefore, in the image pickup device 10, noise is less than that of a case in which the green-use electric storage layer 1110G is in contact with the surface S2 of the semiconductor substrate 1111.

As described above, in this embodiment, since the separation section 110E is provided between the surface S2 of the semiconductor substrate 11 and the green-use electric storage layer 110G, generation of noise may be suppressed.

A description will be given below of modifications of the foregoing embodiment. In the following description, for the same components as those of the foregoing embodiment, the same referential symbols will be affixed thereto and descriptions thereof will be omitted as appropriate.

[Modification 1]

FIG. 16 illustrates a cross-sectional configuration of an image pickup device (an image pickup device 10A) according to Modification 1 of the foregoing first embodiment. The image pickup device 10A is a frontside illumination type, and is provided with the multilayer wiring layer 51 on the surface S1 (light receiving surface) of the semiconductor substrate 11. Except for this point, the image pickup device 10A has a configuration similar to that of the image pickup device 10, and a function and an effect thereof are similar to those of the image pickup device 10.

The green-use electric storage layer 110G of the image pickup device 10A has the separation section 110E between the green-use electric storage layer 110G and the surface S1 of the semiconductor substrate 11 (FIG. 17). Electrons that are generated in the organic photoelectric conversion section 11G and are extracted from the lower electrode 12 are accumulated in the green-use electric storage layer 110G through the conductive plugs 120a3, 120a2, and 120a1 (FIG. 2), the wiring 120A, and the contact 131.

[Modification 2]

FIG. 18 illustrates a cross-sectional configuration of a main section of an image pickup device (an image pickup device 10B) according to Modification 2 of the foregoing first embodiment. An insulating section (an insulating section 133) having negative fixed charge is buried in the connection hole H1 of the image pickup device 10B. Except for this point, the image pickup device 10B has a configuration similar to that of the image pickup device 10, and a function and an effect thereof are similar to those of the image pickup device 10.

The insulating section 133 includes an insulating section 133A made of a material having negative fixed charge such as hafnium oxide, aluminum oxide, and tantalum oxide and an insulating section 133B made of silicon oxide. For the insulating section 133A, an oxide, an oxynitride, or the like of zirconium, titanium, yttrium, or lanthanoid may be used. In the insulating section 133, for example, the insulating section 133A and the insulating section 133B may be provided in order from the contact 131 side. Alternatively, the insulating section 133 may be configured of only the insulating section 133A.

As illustrated in FIG. 19, in the insulating section 133, a hole of the silicon layer 110 is induced to form a p-type region 133p around the insulating section 133. Thereby, the depletion layer D is narrowed and a contact area between the depletion layer D and the insulating section 133 is decreased. Therefore, generation of noise may be more effectively suppressed. A description will be given below of a mechanism thereof.

A spreading state of the depletion layer D varies according to a relative relation between a p-type impurity concentration and an n-type impurity concentration. Specifically, in the case where the n-type impurity concentration is high, the depletion layer D extends to a p-type region P more than to an n-type region N with respect to an interface Db between the p-type region P and the n-type region N (FIG. 20A). In contrast, in the case where the p-type impurity concentration is high, the depletion layer D extends to the n-type region N more than to the p-type region P with respect to the interface Db (FIG. 20B).

More specifically, in the case where the n-type impurity concentration of the green-use electric storage layer 110G is high, the depletion layer D extends to the p-type semiconductor well region around the green-use electric storage layer 110G. In the image pickup device 10B, the depletion layer D is decreased by the insulating section 133 (a p-type region 133p) having negative fixed charge, and generation of noise may be suppressed.

For example, the insulating section 133 may be formed as follows. First, as illustrated in FIG. 21A, an insulating film 133MB made of, for example, silicon oxide and an insulating film 133MA made of hafnium oxide are formed in this order from the side wall to the bottom surface of the connection hole H1. The insulating film 133MB may be formed by oxidizing the silicon layer 110. Next, the insulating films 133MA and 133MB in the bottom surface of the connection hole H1 are removed by anisotropic etching, and thereby, the insulating section 133 is formed (FIG. 21B). The contact 131 is provided in the connection hole H1, and the green-use electric storage layer 110G and the contact 131 are electrically connected.

[Modification 3]

Instead of the foregoing insulating section 133 having negative fixed charge, an insulating section 134 (FIG. 22) having positive fixed charge may be provided (Modification 3). The insulating section 134 includes an insulating section 134A made of a material having positive fixed charge such as silicon nitride and an insulating section 134B made of, for example, silicon oxide. In the insulating section 134, the insulating section 134A and the insulating section 134B may be provided in order from, for example, the contact 131 side. The insulating film 134 may be configured of only the insulating section 134A. However, by forming the insulating section 134B, a defective level of an interface with respect to the silicon layer 110 may be decreased.

As illustrated in FIG. 23, in the case where the n-type impurity concentration of the green-use electric storage layer 110G is low (the p-type impurity concentration in the p-type semiconductor well region is high), the depletion layer D extends to the green-use electric storage layer 110G. The insulating section 134 induces electrons of the silicon layer 110 to form an n-type region 134n around the insulating section 134. Thereby, the depletion layer D is reduced, and generation of noise may be suppressed.

For example, the insulating section 134 may be formed as follows. An insulating film 134MB made of silicon oxide and an insulating film 134MA made of silicon nitride are formed in this order from the side wall to the bottom surface of the connection hole H1 (FIG. 24A). Subsequently, the insulating films 134MA and 134MB in the bottom surface of the connection hole H1 are removed, and thereby, the insulating section 134 is formed (FIG. 24B). The insulating film 134MB may be formed by oxidizing the silicon layer 110. The contact 131 is provided in the connection hole H1, and the green-use electric storage layer 110G and the contact 131 are electrically connected.

[Modification 4]

FIG. 25 illustrates a cross-sectional configuration of a main section of an image pickup device (an image pickup device 10C) according to Modification 4 of the foregoing first embodiment. In the image pickup device 10C, an insulating film 54 having negative fixed charge is in contact with a surface (surface S2) of the semiconductor substrate 11. Except for this point, the image pickup device 10C has a configuration similar to that of the image pickup device 10, and a function and an effect thereof are similar to those of the image pickup device 10.

The semiconductor substrate 11 has a p-type semiconductor well region in the vicinity of the surface S2. By providing the insulating film 54, a hole accumulation concentration of the p-type semiconductor well region is increased, and generation of noise may be more effectively decreased. The insulating film 54 includes an insulating film 54A made of, for example, silicon oxide and an insulating film 54B made of a material having negative fixed charge such as hafnium oxide, aluminum oxide, and tantalum oxide. The insulating film 54A and the insulating film 54B are provided in order from the surface S1 side of the semiconductor substrate 11. For the insulating film 54B, an oxide or an oxynitride of zirconium, titanium, yttrium, or lanthanoid may be used. Alternatively, the insulating film 54 may be configured of only the insulating film 54B. In the image pickup device 10C, for example, the connection hole H1 (the contact 131) may be formed after layering the insulating film 54 and the interlayer insulating film 52 on the surface S1 of the semiconductor substrate 11.

[Modification 5]

In the foregoing first embodiment, the description has been provided of the case in which the connection hole H1 is formed after providing the green-use electric storage layer 110G in the semiconductor substrate 11. Alternatively, the green-use electric storage layer 110G may be formed with the use of the connection hole H1 after forming the connection hole H1 (Modification 5).

First, as illustrated in FIG. 26A, the connection hole H1 is formed in a region from the interlayer insulating film 52 to the semiconductor substrate 11. Thereafter, an insulating film 132M is formed from the side wall to the bottom surface of the connection hole H1 (FIG. 26B). The insulating film 132M may be formed by oxidizing the silicon layer 110. Subsequently, as illustrated in FIG. 27A, ion implantation of an n-type impurity is performed on the semiconductor substrate 11 by self-aligning with the use of the connection hole H1. Thereby, the green-use electric storage layer 110G is formed. Thereafter, the insulating film 132M in the bottom surface of the connection hole H1 is removed to form the contact 131 (FIG. 27B). The ion implantation may be performed, for example, after removing the insulating film 132M in the bottom surface of the connection hole H1. Alternatively, the ion implantation may be performed, for example, before forming the insulating film 132M. By providing the insulating film 132M before the ion implantation, incorporation of impurity in the semiconductor substrate 11 due to the ion implantation may be prevented.

In the self-aligning with the use of the connection hole H1, it becomes possible to decrease a formation region of the green-use electric storage layer 110G and to obtain the formation region of the green-use electric storage layer 110G having the substantially same size as that of the connection hole H1 in planar view. In other words, the green-use electric storage layer 110G is provided only in a region from the contact 131 to the vicinity thereof in planar view. Thereby, a contact area between the green-use electric storage layer 110G (n-type region) and the p-type semiconductor well region in the semiconductor substrate 11, that is, an pn-junction surface is decreased, and therefore, the depletion layer (the depletion layer D) is decreased. Therefore, the generation of noise due to the depletion layer may be further decreased. It is to be noted that, since the number of defects of the semiconductor substrate 11 is comparatively small, an influence of depletion layers other than the depletion layer D upon noise is smaller than an influence of the depletion layer D in contact with the insulating section 132 upon noise.

[Modification 6]

FIG. 28 illustrates a cross-sectional configuration of a main section of an image pickup device (an image pickup device 10D) according to Modification 6 of the foregoing first embodiment. The green-use electric storage layer 110G of the image pickup device 10D is configured of a plurality of n-type regions (n-type regions 110G-1 and 110G-2) having different n-type impurity concentrations. Except for this point, the image pickup device 10D has a configuration similar to that of the image pickup device 10, and a function and an effect thereof are similar to those of the image pickup device 10.

The green-use electric storage layer 110G includes the n-type region 110G-1 having a low n-type impurity concentration and the n-type region 110G-2 having a high n-type impurity concentration. The n-type region 110G-2 is provided in the n-type region 110G-1 that is provided in a wider region. The n-type regions 110G-2 exists only in the vicinity of the contact 131 (the connection hole H1) in planar view.

An amount of noise also varies according to magnitude of electric field applied to a depletion layer. By decreasing the electric field, noise may be suppressed. In the pickup device 10D, the n-type region 110G-1 is provided around the n-type region 110G-2. The n-type region 110G-1 having the low n-type impurity concentration is in contact with a p-type semiconductor well region. Thereby, an electric field applied to the depletion layer D between the green-use electric storage layer 110G and the p-type semiconductor well region is modified, and noise may be more effectively decreased.

The foregoing green-use electric storage layer 110G may be formed, for example, as follows. First, as illustrated in FIG. 29A, the n-type region 110G-1 is previously provided in the semiconductor substrate 11 to form the connection hole H1 reaching the n-type region 110G-1. Next, the insulating film 132M is formed from the side wall to the bottom surface of the connection hole H1 (FIG. 29B). Subsequently, ion implantation is performed by self-aligning with the use of the connection hole H1 to provide the n-type region 110G-2 (FIG. 29C). Thereby, the green-use electric storage layer 110G is formed. Thereafter, the insulating film 132M in the bottom surface of the connection hole H1 is removed, and the contact 131 is buried in the connection hole H1. As in the foregoing Modification 5, the n-type region 110G-2 may be provided after removing the insulating film 132M in the bottom surface of the connection hole H1. Alternatively, the n-type region 110G-2 may be formed before forming the insulating film 132M.

In the foregoing first embodiment and the modifications thereof, the description has been provided of the case in which noise is decreased a by connection between the organic photoelectric conversion section 11G and the green-use electric storage layer 110G. However, such a technology is applicable to any configuration when connecting inside of a semiconductor substrate to outside thereof. A description will be given below of such an application.

Second Embodiment

FIG. 30 illustrates a cross-sectional configuration of a main section of an image pickup device (an image pickup device 20) according to a second embodiment of the present technology. The image pickup device 20 has the inorganic photoelectric conversion section 11B (11R) in the semiconductor substrate 11, and may configure, for example, a CMOS image sensor having a global shutter function. The multilayer wiring layer 51 of the image pickup device 20 is provided with a retentive capacity 55 (first retentive capacity). The retentive capacity 55 outside the semiconductor substrate 11 is connected to an n-type region (an electric storage layer 116) in the semiconductor substrate 11 with the use of the contact 131.

In the image pickup device 20, in addition to the reset transistor Tr1 and the amplification transistor Tr2, a transfer transistor Tr6 and a selective reading-use transistor Tr7 may be provided, for example, in the vicinity of the surface S2 of the semiconductor substrate 11. The foregoing electric storage layer 116 in the n-type region configures the transfer transistor Tr6 together with a gate electrode GE6, and is arranged close to the inorganic photoelectric conversion section 11B. The transistor Tr7 has a gate electrode GE7 and a floating diffusion (FD117) in the n-type region. In the image pickup device 20, for example, charge generated and accumulated in the inorganic photoelectric conversion section 11B may be read for all pixels concurrently, the read charge is accumulated in the electric storage layer 116 and subsequently is selectively read into the FD117 for each of pixels. The retentive capacity 55 is configured of a pair of electrodes 55A and 55B. One electrode thereof (the electrode 55B) is electrically connected to the electric storage layer 116 through the contact 131. By providing the retentive capacity 55, a saturated charge amount is allowed to be increased.

As illustrated in FIG. 31, the separation section 110E (p-type semiconductor well region) is provided between the electric storage layer 116 and the surface S2 of the semiconductor substrate 11. Thereby, the depletion layer D between the electric storage layer 116 and the p-type semiconductor well region is prevented from being in contact with the interlayer insulating film 52. Therefore, generation of noise at the time of transfer of signal charge between the retentive capacity 55 outside the semiconductor substrate 11 and the electric storage layer 116 in the semiconductor substrate 11 may be suppressed.

Third Embodiment

FIG. 32 illustrates a cross-sectional configuration of a main section of an image pickup device (an image pickup device 30) according to a third embodiment of the present technology. In the image pickup device 30, a transfer transistor Tr8 is provided in the vicinity of the surface S2 of the semiconductor substrate 11 together with the reset transistor Tr1 and the amplification transistor Tr2. The transistor Tr8 has a gate electrode GE8 and a floating diffusion (FD118) in the n-type region. The FD118 is electrically connected to the transistor Tr2 through the contact 131 and the wiring 120A.

In the image pickup device 30, signal charge generated in the inorganic photoelectric conversion section 11B (11R) in the semiconductor substrate 11 is read into the FD118 and is accumulated. The signal charge read into the FD118 is amplified by the transistor Tr2, and is sent to the vertical signal line $L_{sig}$ (after-mentioned FIG. 34). As illustrated in FIG. 33, the separation section 110E (p-type semiconductor well region) is provided between the FD118 and the surface S2 of the semiconductor substrate 11. Therefore, a depletion layer between the FD118 and the p-type semiconductor well region may be prevented from being in contact with the interlayer insulating film 52. Therefore, generation of noise at the time of transfer of signal charge between the gate electrode GE2 of the transistor Tr2 outside the semiconductor substrate 11 and the FD118 in the semiconductor substrate 11 may be suppressed.

Application Example

FIG. 34 illustrates a whole configuration of the solid-state image pickup unit (the image pickup unit 1) using any of the image pickup devices (the image pickup devices 10, 10A, 10B, 10C, 10D, 20, and 30) described in the foregoing embodiments and the modifications for each pixel. The image pickup unit 1 (semiconductor unit) is a CMOS image sensor, and has a pixel section 1a as an image pickup area in the central part on the semiconductor substrate 11. In the peripheral region of the pixel section 1a, for example, a peripheral circuit section 230 including a row scanning section 231, a system control section 232, a horizontal selection section 233, and a column scanning section 234 is provided.

The pixel section 1a may have, for example, a plurality of unit pixels P (corresponding to any of the image pickup devices 10, 10A, 10B, 10C, 20, and 30) that are two-dimensionally arranged in a state of matrix. In each of the unit pixels P, for example, a pixel drive line $L_{read}$ (specifically, a row selection line and a reset control line) is arranged for each of pixel rows, and the vertical signal line $L_{sig}$ is arranged for each of pixel columns. The pixel drive line $L_{read}$ transmits drive signals for reading signals from the pixels, and one end thereof is connected to an output end corresponding to each row of the row scanning section 231.

The row scanning section 231 may be configured of a shift transistor, an address decoder, or the like, and may be a pixel drive section that drives each pixel P of the pixel section 1a in units of row, for example. A signal outputted from each pixel P of a pixel row selected by the row scanning section 231 is supplied to the horizontal selection section 233 through each vertical signal line $L_{sig}$. The horizontal selection section 233 may be configured of, for example, an amplifier, a horizontal selection switch, or the like that is provided for each of the vertical signal lines $L_{sig}$.

The column scanning section 234 may be configured of a shift transistor, an address decoder, or the like, and drives each horizontal selection switch of the horizontal selection section 233 in order while scanning the same. By the selection scanning by the column scanning section 234, a signal of each pixel P transmitted through each of the vertical signal lines $L_{sig}$ is outputted to a horizontal signal line 235 in order, and the outputted signal is transmitted outside the semiconductor substrate 11 through the horizontal signal line 235.

The circuit section configured of the row scanning section 231, the horizontal selection section 233, the column scanning section 234, and the horizontal signal line 235 may be formed directly on the semiconductor substrate 11, or may be arranged in an external control IC. Alternatively, the circuit section may be provided on another substrate connected through a cable or the like.

The system control section 232 may receive clock order data and an operation mode provided from outside of the semiconductor substrate 11 and/or the like, and outputs internal information of the image pickup unit 1. In addition thereto, the system control section 232 may have, for example, a timing generator creating various timing signals, and performs drive control of the peripheral circuit such as the row scanning section 231, the horizontal selection section 233, and the column scanning section 234 based on the various timing signals created by the timing generator.

The foregoing image pickup unit 1 may be mounted on any type of electronic apparatus having an image pickup function, and is applicable to, for example, a camera system such as a digital still camera and a camcorder, a mobile phone, or the like. As an example, FIG. 35 illustrates a schematic configuration of a camera (an electronic apparatus 2). The electronic apparatus 2 may be, for example, a camcorder capable of shooting a still image or an moving image, and may have the image pickup unit 1, an optical system (optical lens) 310, a shutter device 311, a signal processing section 312, and a drive section 313.

The optical system 310 guides image light (incident light) from an object to the pixel section 1a of the image pickup unit 1. The optical system 310 may include a plurality of optical lenses. The shutter device 311 controls a time period for light illumination to the image pickup unit 1, and a light blocking time period. The drive section 313 controls a shutter operation of the shutter device 311 and a transmission operation of the image pickup unit 1. The signal processing section 312 performs various signal processings on a signal outputted from the image pickup unit 1. An image signal $D_{out}$ after signal processing is stored in a memory medium such as a memory, or is outputted to a monitor or the like.

The present technology has been described with reference to the embodiments and the modifications. However, the present technology is not limited to the foregoing embodiments and the like, and various modifications may be made. For example, in the foregoing embodiments and the like, the description has been provided of the case in which the organic photoelectric conversion section 11G detecting green color light and the inorganic photoelectric conversion sections 11B and 11R detecting red color light and blue color light and are layered as any of the image pickup devices 10, 10A, 10B, 10C, and 10D. However, the present technology is not limited to such a configuration. For example, an organic photoelectric conversion section may detect red color light or blue color light, and an inorganic photoelectric conversion section may detect green color light. The number and the ratio of organic photoelectric conversion sections and inorganic photoelectric conversion sections are not limited to the example described above. For example, two or more organic photoelectric conversion sections may be provided, or color signals of a plurality of colors may be obtained only by organic photoelectric conversion sections. Photoelectric conversion sections (organic photoelectric conversion sections and inorganic photoelectric conversion sections) may be arranged in parallel with a semiconductor substrate surface, in addition to lamination thereof in a vertical direction.

Further, in addition to providing the insulating section 133 or the insulating section 134 (FIG. 18 and FIG. 22) in the connection hole H1, the insulating film 53 (FIG. 25) may be provided in contact with one surface of the semiconductor substrate 11. Such a configuration is applicable to the frontside-illumination type image pickup device (FIG. 17). Further, any of the image pickup devices (the image pickup devices 10A, 10B, and 10C) according to Modifications 1 to 4 may be manufactured with the use of the method of manufacturing an image pickup device according to the foregoing Modification 5 (FIG. 26A to FIG. 27B). In addition thereto, the insulating section 133, the insulating section 134, or the insulating film 53 may be provided together with the green-use electric storage layer 110G having the plurality of n-type regions with different impurity concentrations. At this time, one of the insulating section 133 and the insulating section 134, and the insulating film 53 may be provided. The green-use electric storage layer 110G in the p-type region may be provided in the n-type semiconductor region.

Furthermore, the image pickup device 20 according to the foregoing second embodiment or the image pickup device 30 according to the foregoing third embodiment may have the organic photoelectric conversion section 11G outside the semiconductor substrate 11.

In addition thereto, it is not necessary to include all the components described in the foregoing embodiments and the like, and other components may be included.

Further, in the foregoing embodiments and the like, the description has been given of the image pickup device having photoelectric conversion sections as an example. However, the present technology is applicable to other semiconductor devices.

It is possible to achieve at least the following configurations from the above-described example embodiments of the disclosure.

(1) A semiconductor device, including:
    a first conductive region in a semiconductor substrate;
    a second conductive region provided in the first conductive region, and separated away from one surface of the semiconductor substrate to form a separation section therebetween;

a contact configured to electrically connect the second conductive region to an external wiring; and an insulating section provided from the first conductive region to the second conductive region, around the contact.

(2) The semiconductor device according to (1), further including an insulating film, the insulating film being in contact with the one surface of the semiconductor substrate.

(3) The semiconductor device according to (1) or (2), further including a pair of electrodes outside the semiconductor substrate, wherein the contact is electrically connected to one of the pair of electrodes through the external wiring.

(4) The semiconductor device according to (3), further including a first photoelectric conversion section inside the semiconductor substrate.

(5) The semiconductor device according to (4), further including a second photoelectric conversion section, the second photoelectric conversion section including a photoelectric conversion film between the pair of electrodes.

(6) The semiconductor device according to (5), wherein the photoelectric conversion film includes an organic semiconductor material.

(7) The semiconductor device according to any one of (1) to (6), wherein the insulating section includes silicon oxide.

(8) The semiconductor device according to any one of (1) to (7), wherein the insulating section includes an oxide or an oxynitride of one or more elements of hafnium, zirconium, aluminum, tantalum, titanium, yttrium, and lanthanoid.

(9) The semiconductor device according to any one of (1) to (8), wherein the insulating section includes silicon nitride.

(10) The semiconductor device according to (2), wherein the insulating film includes an oxide or an oxynitride of one or more elements of hafnium, zirconium, aluminum, tantalum, titanium, yttrium, and lanthanoid.

(11) The semiconductor device according to any one of (1) to (10), further including the second conductive region, the second conductive region being provided from the contact to a vicinity of a circumferential edge of the contact in planar view.

(12) The semiconductor device according to any one of (1) to (11), wherein the second conductive region includes a plurality of regions with different impurity concentrations, and one of the plurality of regions with a high impurity concentration is provided in another of the plurality of regions with a lower impurity concentration.

(13) The semiconductor device according to (3), wherein the pair of electrodes is a first retentive capacity.

(14) The semiconductor device according to (5), further including a second retentive capacity outside the semiconductor substrate.

(15) The semiconductor device according to (5), further including:

an on-chip lens configured to focus light on the second photoelectric conversion section; and a sealing film provided between the on-chip lens and the second photoelectric conversion section, wherein a difference between a refractive index of the sealing film and a refractive index of the on-chip lens is equal to or less than about 0.1

(16) The semiconductor device according to (15), wherein a constituent material of the sealing film is the same as a constituent material of the on-chip lens.

(17) The semiconductor device according to (15), wherein the on-chip lens includes one of silicon nitride, silicon oxynitride, and aluminum oxide.

(18) The semiconductor device according to (15), wherein the on-chip lens includes a planarizing section, the planarizing section infilling concavity and convexity between the on-chip lens and the sealing film.

(19) A semiconductor unit provided with a semiconductor device, the semiconductor device including:

a first conductive region in a semiconductor substrate;

a second conductive region provided in the first conductive region, and separated away from one surface of the semiconductor substrate to form a separation section therebetween;

a contact configured to electrically connect the second conductive region to an external wiring; and an insulating section provided from the first conductive region to the second conductive region, around the contact.

[1] A semiconductor device including:
a conductive region of a first conductivity type having a surface adjacent to a multilayer wiring layer;
a charge accumulation region of a second conductivity type formed within the first conductive region, wherein the charge accumulation region is separated from the surface of the conductive region adjacent to the multilayer wiring layer by a separation section; and
a contact disposed in the conductive region, the contact electrically connecting the charge accumulation region and an external wire of the multilayer wiring layer.

[2] The semiconductor device according to [1], further including an insulating section contacting the contact and provided in a region at least between a portion of the charge accumulation region and the separation section.

[3] The semiconductor device according to [2], wherein an outer circumference of the insulating section is less than the outer circumferences of the charge accumulation region.

[4] The semiconductor device according to any one of [2] or [3], further including a depletion layer, wherein the insulating section is provided in a region between a portion of the charge accumulation region and the separation section where the depletion layer is formed.

[5] The semiconductor device according to any one of [1] to [4], wherein the multilayer wiring layer is provided on an opposite side of a light receiving surface of the conductive region.

[6] The semiconductor device according to any one of [1] to [5], further including:
a photoelectric conversion section disposed above a second surface of the conductive region, the second surface of the conductive region being opposite the surface adjacent to the multilayer wiring layer.

[7] The semiconductor device according to [6], further including:
a conductive plug penetrating the conductive region, wherein the photoelectric conversion section is electrically connected to the conductive plug and the conductive plug is electrically connected to the external wire such that the photoelectric conversion section is electrically connected to the charge accumulation region.

[8] The semiconductor device according to [7], wherein the photoelectric conversion section includes a photoelectric conversion film disposed between an upper electrode and a lower electrode.

[9] The semiconductor device according to [8], further including a second conductive plug penetrating the conductive region and electrically connected to the upper electrode, wherein the conductive plug is electrically connected to the lower electrode.

[10] The semiconductor device according to [9], further including a second photoelectric conversion section disposed within the conductive region.

[11] The semiconductor device according to [10], further including a third photoelectric conversion section disposed within the conductive region.

[12] The semiconductor device according to [11], wherein the first photoelectric conversion section is an organic photoelectric conversion section, the second photoelectric conversion section is an inorganic photoelectric conversion section, and the third photoelectric conversion section is an inorganic photoelectric conversion section.

[13] The semiconductor device according to [11] or [12], wherein the photoelectric conversion section, the second photoelectric conversion section, and the third photoelectric conversion section are layered in a vertical direction corresponding to a direction in which light enters the image pickup device.

[14] A solid-state image pickup unit including a pixel section having a plurality of unit pixels two-dimensionally arranged in a matrix formation, wherein a unit pixel includes:
a conductive region of a first conductivity type having a surface adjacent to a multilayer wiring layer;
a charge accumulation region of a second conductivity type formed within the first conductive region, wherein the charge accumulation region is separated from the surface of the conductive region adjacent to the multilayer wiring layer by a separation section; and
a contact disposed in the conductive region, the contact electrically connecting the charge accumulation region and an external wire of the multilayer wiring layer.

[15] The solid-state image pickup unit according to [14], further including an insulating section contacting the contact and provided in a region at least between a portion of the charge accumulation region and the separation section.

[16] The solid-state image pickup unit according to [15], further including:
a photoelectric conversion section disposed above a second surface of the conductive region, the second surface of the conductive region being opposite the surface adjacent to the multilayer wiring layer; and
a conductive plug penetrating the conductive region, wherein the photoelectric conversion section is electrically connected to the conductive plug and the conductive plug is electrically connected to the external wire such that the photoelectric conversion section is electrically connected to the charge accumulation region.

[17] The solid-state image pickup unit according to [16], further including a second photoelectric conversion section disposed within the conductive region.

[18] The solid-state image pickup unit according to [17], wherein the multilayer wiring layer is provided on an opposite side of a light receiving surface of the conductive region.

[19] A method of manufacturing a semiconductor device including:
forming, within a conductive region of a first conductivity type, a charge accumulation region of a second conductivity type, wherein the charge accumulation region is separated from a surface of the conductive region adjacent to a multilayer wiring layer by a separation section;
forming the multilayer wiring layer on a surface of the conductive region of the first conductivity type, wherein forming the multilayer wiring layer includes:
forming a connection hole extending from the multilayer wiring layer to the charge accumulation layer;
providing an insulation film on a sidewall of the connection hole to form an insulation section;
burying material in the connection hole such that a contact is electrically connected to the charge accumulation region;
forming an external wire of the multilayer wiring layer, wherein the external wire is electrically connected to the charge accumulation region via the contact; and
bonding a support substrate to the multilayer wiring layer.

[20] The method of manufacturing a semiconductor device according to [19], wherein an outer circumference of the insulating section is less than the outer circumferences of the charge accumulation region.

[21] The method of manufacturing a semiconductor device according to [20], further including providing the insulating section in a region between a portion of the charge accumulation region and the separation section.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor device comprising:
a conductive region of a first conductivity type having a surface adjacent to a multilayer wiring layer;
a charge accumulation region of a second conductivity type formed within the conductive region, wherein the charge accumulation region is separated from the surface of the conductive region adjacent to the multilayer wiring layer by a separation section; and
a contact disposed in the conductive region, the contact electrically connecting the charge accumulation region and an external wire of the multilayer wiring layer, wherein the multilayer wiring layer is provided on a side of the conductive region opposite a light receiving surface of the conductive region.

2. The semiconductor device according to claim 1, further comprising an insulating section contacting the contact and provided in a region at least between a portion of the charge accumulation region and the separation section.

3. The semiconductor device according to claim 2, wherein an outer circumference of the insulating section is less than the outer circumferences of the charge accumulation region.

4. The semiconductor device according to claim 2, further comprising a depletion layer, wherein the insulating section is provided in a region between a portion of the charge accumulation region and the separation section where the depletion layer is formed.

5. The semiconductor device according to claim 1, further comprising:
a first photoelectric conversion section disposed above a second surface of the conductive region, the second surface of the conductive region being opposite the surface adjacent to the multilayer wiring layer.

6. The semiconductor device according to claim 5, further comprising:
a conductive plug penetrating the conductive region, wherein the first photoelectric conversion section is electrically connected to the conductive plug and the conductive plug is electrically connected to the external wire such that the first photoelectric conversion section is electrically connected to the charge accumulation region.

7. The semiconductor device according to claim 6, wherein the first photoelectric conversion section comprises a photoelectric conversion film disposed between an upper electrode and a lower electrode.

8. The semiconductor device according to claim 7, further comprising a second conductive plug penetrating the conductive region and electrically connected to the upper electrode, wherein the conductive plug is electrically connected to the lower electrode.

9. The semiconductor device according to claim 8, further comprising a second photoelectric conversion section disposed within the conductive region.

10. The semiconductor device according to claim 9, further comprising a third photoelectric conversion section disposed within the conductive region.

11. The semiconductor device according to claim 10, wherein the first photoelectric conversion section is an organic photoelectric conversion section, the second photoelectric conversion section is an inorganic photoelectric conversion section, and the third photoelectric conversion section is an inorganic photoelectric conversion section.

12. The semiconductor device according to claim 10, wherein the photoelectric conversion section, the second photoelectric conversion section, and the third photoelectric conversion section are layered in a vertical direction corresponding to a direction in which light enters the image pickup device.

13. A solid-state image pickup unit comprising a pixel section having a plurality of unit pixels two-dimensionally arranged in a matrix formation, wherein a unit pixel comprises:

a conductive region of a first conductivity type having a surface adjacent to a multilayer wiring layer;

a charge accumulation region of a second conductivity type formed within the conductive region, wherein the charge accumulation region is separated from the surface of the conductive region adjacent to the multilayer wiring layer by a separation section;

a contact disposed in the conductive region, the contact electrically connecting the charge accumulation region and an external wire of the multilayer wiring layer;

an insulating section contacting the contact and provided in a region at least between a portion of the charge accumulation region and the separation section;

a first photoelectric conversion section disposed above a second surface of the conductive region, the second surface of the conductive region being opposite the surface adjacent to the multilayer wiring layer;

a conductive plug penetrating the conductive region, wherein the first photoelectric conversion section is electrically connected to the conductive plug and the conductive plug is electrically connected to the external wire such that the first photoelectric conversion section is electrically connected to the charge accumulation region; and a second photoelectric conversion section disposed within the conductive region, wherein the multilayer wiring layer is provided on a side of the conductive region opposite a light receiving surface of the conductive region.

* * * * *